(12) United States Patent
Cola et al.

(10) Patent No.: US 8,919,428 B2
(45) Date of Patent: Dec. 30, 2014

(54) METHODS FOR ATTACHING CARBON NANOTUBES TO A CARBON SUBSTRATE

(75) Inventors: Baratunde A. Cola, Atlanta, GA (US); Timothy S. Fisher, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 1271 days.

(21) Appl. No.: 12/688,517

(22) Filed: Jan. 15, 2010

(65) Prior Publication Data

US 2010/0200208 A1    Aug. 12, 2010

Related U.S. Application Data

(63) Continuation-in-part of application No. 11/873,952, filed on Oct. 17, 2007, now Pat. No. 8,220,530.

(60) Provisional application No. 61/144,915, filed on Jan. 15, 2009.

(51) Int. Cl.
*F28F 7/00* (2006.01)
*B82Y 10/00* (2011.01)
(Continued)

(52) U.S. Cl.
CPC ............... *B01J 23/745* (2013.01); *Y02E 60/50* (2013.01); *C01B 2202/08* (2013.01);
(Continued)

(58) Field of Classification Search
CPC ............ C01B 2202/08; C01B 31/0233; C01B 31/0226; B82Y 10/00; B82Y 40/00; B82Y 30/00; H01L 51/0048; H01L 51/102; H01M 4/8605; H01M 4/8807; B01J 37/0244; B01J 37/0238

USPC ................ 165/185, 80.3, 133; 361/704, 705; 977/742; 423/477.1; 428/408, 617; 501/95.2

See application file for complete search history.

(56) References Cited

U.S. PATENT DOCUMENTS 6,156,256 A    12/2000   Kennel
6,283,812 B1    9/2001   Jin et al.
(Continued)

FOREIGN PATENT DOCUMENTS

EP    1134304    9/2001
EP    1329953    7/2003
(Continued)

OTHER PUBLICATIONS

Christopher et al., Carbon Velvet Thermal Interface Gasket, Jan. 11, 2001, Paper for 39th AIAA Aerospace Sciences Meeting, pp. -14.*

(Continued)

*Primary Examiner* — Tho V Duong
(74) *Attorney, Agent, or Firm* — John V. Daniluck; Douglas G. Gallagher; Bingham Greenebaum Doll LLP

(57) ABSTRACT

Vertically oriented carbon nanotubes (CNT) arrays have been simultaneously synthesized at relatively low growth temperatures (i.e., <700° C.) on both sides of aluminum foil via plasma enhanced chemical vapor deposition. The resulting CNT arrays were highly dense, and the average CNT diameter in the arrays was approximately 10 nm, A CNT TIM that consist of CNT arrays directly and simultaneously synthesized on both sides of various types of foil has been fabricated. The TIM is insertable and allows temperature sensitive and/or rough substrates to be interfaced by highly conductive and conformable CNT arrays. The use of foil, including substrates fabricated from carbon (CNT woven arrays, exfoliated graphite sheets, bucky paper, and the like) is disclosed.

22 Claims, 26 Drawing Sheets

(51) Int. Cl.

| | | |
|---|---|---|
| *B82Y 40/00* | (2011.01) | |
| *H01L 51/00* | (2006.01) | |
| *B82Y 30/00* | (2011.01) | |
| *B01J 37/02* | (2006.01) | |
| *C01B 31/02* | (2006.01) | |
| *H01M 4/88* | (2006.01) | |
| *H01L 51/10* | (2006.01) | |
| *B01J 23/745* | (2006.01) | |
| *H05K 7/20* | (2006.01) | |
| *H01M 4/86* | (2006.01) | |

(52) U.S. Cl.
CPC ............... *B82Y 10/00* (2013.01); *B82Y 40/00* (2013.01); *H01L 51/0048* (2013.01); *H01M 4/8605* (2013.01); *B82Y 30/00* (2013.01); *B01J 37/0244* (2013.01); *C01B 31/0233* (2013.01); *H01M 4/8807* (2013.01); *H01L 51/102* (2013.01); *C01B 31/0226* (2013.01); *B01J 37/0238* (2013.01)
USPC .......................................... 165/185; 361/704

(56) References Cited

U.S. PATENT DOCUMENTS

| | | | |
|---|---|---|---|
| 6,284,085 | B1 | 9/2001 | Gwo |
| 6,359,334 | B1 | 3/2002 | Jiang |
| 6,383,923 | B1 | 5/2002 | Brown |
| 6,407,922 | B1 | 6/2002 | Eckblad et al. |
| 6,628,053 | B1 | 9/2003 | Den et al. |
| 6,682,677 | B2 | 1/2004 | Lobovsky et al. |
| 6,713,519 | B2 | 3/2004 | Wang et al. |
| 6,737,939 | B2 | 5/2004 | Hoppe et al. |
| 6,741,019 | B1 | 5/2004 | Filas et al. |
| 6,764,628 | B2 | 7/2004 | Lobovsky et al. |
| 6,831,359 | B2 | 12/2004 | Heilbronner |
| 6,891,724 | B2 * | 5/2005 | De Lorenzo et al. ......... 361/704 |
| 6,911,260 | B2 | 6/2005 | Ren et al. |
| 6,913,075 | B1 * | 7/2005 | Knowles et al. ............. 165/185 |
| 6,921,462 | B2 | 7/2005 | Montgomery et al. |
| 6,924,335 | B2 | 8/2005 | Fan et al. |
| 6,965,513 | B2 | 11/2005 | Montgomery et al. |
| 6,976,532 | B2 | 12/2005 | Zhan et al. |
| 6,982,874 | B2 | 1/2006 | Smalc et al. |
| 6,994,584 | B1 | 2/2006 | Santana, Jr. et al. |
| 7,025,607 | B1 | 4/2006 | Das et al. |
| 7,056,409 | B2 | 6/2006 | Dubrow |
| 7,086,451 | B2 | 8/2006 | Leu et al. |
| 7,094,679 | B1 | 8/2006 | Li et al. |
| 7,102,285 | B2 | 9/2006 | Chen et al. |
| 7,105,596 | B2 | 9/2006 | Smalley et al. |
| 7,109,581 | B2 | 9/2006 | Dangelo et al. |
| 7,168,484 | B2 | 1/2007 | Zhang et al. |
| 7,180,174 | B2 | 2/2007 | Koning et al. |
| 7,181,811 | B1 | 2/2007 | Tomanek et al. |
| 7,197,804 | B2 | 4/2007 | Muller et al. |
| 7,217,650 | B1 | 5/2007 | Ng et al. |
| 7,235,159 | B2 | 6/2007 | Gu et al. |
| 7,235,421 | B2 | 6/2007 | Chopra et al. |
| 7,269,008 | B2 | 9/2007 | Mongia et al. |
| 7,272,010 | B1 | 9/2007 | Santana, Jr. et al. |
| 7,273,095 | B2 | 9/2007 | Li et al. |
| 7,297,399 | B2 | 11/2007 | Zhang et al. |
| 7,311,967 | B2 | 12/2007 | Dani et al. |
| 7,354,877 | B2 | 4/2008 | Rosenberger et al. |
| 7,393,428 | B2 | 7/2008 | Huang et al. |
| 7,416,019 | B2 * | 8/2008 | Osiander et al. ................ 165/96 |
| 7,438,844 | B2 | 10/2008 | Huang et al. |
| 7,456,052 | B2 | 11/2008 | White et al. |
| 7,459,013 | B2 | 12/2008 | Holmes et al. |
| 7,477,527 | B2 | 1/2009 | Suhir |
| 7,479,516 | B2 | 1/2009 | Chen et al. |
| 7,481,267 | B2 | 1/2009 | Zhan et al. |
| 7,494,910 | B2 | 2/2009 | Mouli et al. |
| 7,507,987 | B2 | 3/2009 | Kim et al. |
| 7,531,464 | B2 | 5/2009 | White et al. |
| 7,535,715 | B2 | 5/2009 | Chung |
| 7,538,422 | B2 | 5/2009 | Dangelo et al. |
| 7,569,425 | B2 | 8/2009 | Huang et al. |
| 7,652,492 | B2 | 1/2010 | Wang et al. |
| 7,656,027 | B2 | 2/2010 | Dangelo et al. |
| 7,662,467 | B2 | 2/2010 | Li et al. |
| 7,674,410 | B2 | 3/2010 | Huang et al. |
| 7,678,222 | B2 | 3/2010 | Grier et al. |
| 7,682,654 | B2 | 3/2010 | Cooper et al. |
| 7,687,876 | B2 | 3/2010 | Kabir et al. |
| 7,695,811 | B2 | 4/2010 | Northen et al. |
| 7,704,462 | B2 | 4/2010 | Montgomery et al. |
| 7,704,791 | B2 | 4/2010 | Dubin et al. |
| 7,732,918 | B2 | 6/2010 | Dangelo et al. |
| 7,898,079 | B2 * | 3/2011 | Lashmore et al. ............ 257/720 |
| 2003/0117770 | A1 | 6/2003 | Montgomery et al. |
| 2003/0179559 | A1 | 9/2003 | Engelhardt et al. |
| 2003/0231471 | A1 | 12/2003 | De Lorenzo et al. |
| 2004/0009353 | A1 * | 1/2004 | Knowles et al. ........... 428/411.1 |
| 2004/0043219 | A1 | 3/2004 | Ito et al. |
| 2004/0102044 | A1 | 5/2004 | Mao et al. |
| 2004/0184241 | A1 | 9/2004 | De Lorenzo et al. |
| 2004/0256975 | A1 | 12/2004 | Gao et al. |
| 2004/0261987 | A1 | 12/2004 | Zhang et al. |
| 2004/0265489 | A1 | 12/2004 | Dubin |
| 2004/0266065 | A1 | 12/2004 | Zhang et al. |
| 2005/0037204 | A1 | 2/2005 | Osiander et al. |
| 2005/0046017 | A1 | 3/2005 | Dangelo |
| 2005/0061496 | A1 | 3/2005 | Matabayas, Jr. |
| 2005/0064185 | A1 | 3/2005 | Buretea et al. |
| 2005/0092464 | A1 | 5/2005 | Leu et al. |
| 2005/0129928 | A1 | 6/2005 | Lee et al. |
| 2005/0145367 | A1 | 7/2005 | Hannah et al. |
| 2005/0180113 | A1 | 8/2005 | Shirakami et al. |
| 2005/0215049 | A1 * | 9/2005 | Horibe et al. ................. 438/622 |
| 2005/0224220 | A1 | 10/2005 | Li et al. |
| 2005/0238810 | A1 | 10/2005 | Scaringe et al. |
| 2005/0255304 | A1 | 11/2005 | Brink |
| 2005/0260412 | A1 | 11/2005 | Gardner |
| 2005/0269559 | A1 | 12/2005 | Zhou et al. |
| 2006/0009110 | A1 | 1/2006 | Chih-Che et al. |
| 2006/0032622 | A1 | 2/2006 | Yen et al. |
| 2006/0068195 | A1 | 3/2006 | Majumdar et al. |
| 2006/0083927 | A1 | 4/2006 | Von Ehr |
| 2006/0118791 | A1 | 6/2006 | Leu et al. |
| 2006/0157223 | A1 | 7/2006 | Gelorme et al. |
| 2006/0163622 | A1 | 7/2006 | Montgomery et al. |
| 2006/0188721 | A1 | 8/2006 | Irvin, Jr. et al. |
| 2006/0208354 | A1 | 9/2006 | Liu et al. |
| 2006/0231946 | A1 | 10/2006 | Pan et al. |
| 2006/0234080 | A1 * | 10/2006 | Seidel et al. .................. 428/627 |
| 2006/0238096 | A1 * | 10/2006 | Han et al. ...................... 313/311 |
| 2007/0108068 | A1 | 5/2007 | Suh et al. |
| 2007/0116626 | A1 | 5/2007 | Pan et al. |
| 2007/0116957 | A1 | 5/2007 | Pan et al. |
| 2008/0075954 | A1 | 3/2008 | Wardle et al. |
| 2008/0131655 | A1 | 6/2008 | Wacker et al. |
| 2008/0131722 | A1 | 6/2008 | Suhir et al. |
| 2008/0149322 | A1 | 6/2008 | Ottinger et al. |
| 2008/0171194 | A1 * | 7/2008 | Ko et al. ........................ 428/328 |
| 2008/0176058 | A1 | 7/2008 | Maschmann et al. |
| 2008/0210370 | A1 | 9/2008 | Smalley et al. |
| 2008/0236804 | A1 | 10/2008 | Cola et al. |
| 2008/0241755 | A1 | 10/2008 | Franklin et al. |
| 2008/0286564 | A1 | 11/2008 | Tsotsis |
| 2008/0308222 | A1 | 12/2008 | Sauer et al. |
| 2009/0061217 | A1 | 3/2009 | Silva et al. |
| 2009/0115286 | A1 | 5/2009 | Asaka et al. |
| 2009/0194424 | A1 | 8/2009 | Franklin et al. |
| 2009/0294046 | A1 | 12/2009 | Sim et al. |
| 2009/0314528 | A1 | 12/2009 | Hirose et al. |
| 2009/0320991 | A1 | 12/2009 | Boyle et al. |
| 2010/0002362 | A1 | 1/2010 | Clelland et al. |
| 2010/0012267 | A1 | 1/2010 | Lalli et al. |
| 2010/0019646 | A1 | 1/2010 | Lukehart et al. |
| 2010/0079842 | A1 | 4/2010 | Dunleavy et al. |
| 2010/0128439 | A1 * | 5/2010 | Tilak et al. .................... 361/709 |

(56) References Cited

U.S. PATENT DOCUMENTS

| | | | |
|---|---|---|---|
| 2010/0136327 | A1 | 6/2010 | Ma et al. |
| 2010/0137541 | A1 | 6/2010 | Russell et al. |
| 2011/0059317 | A1 | 3/2011 | Elhard et al. |

FOREIGN PATENT DOCUMENTS

| | | |
|---|---|---|
| JP | 2005228954 | 8/2005 |
| WO | 0139235 | 5/2001 |
| WO | 03052181 | 6/2003 |
| WO | 2004090944 | 10/2004 |
| WO | 2005028549 | 3/2005 |
| WO | 2006048843 | 5/2006 |
| WO | 2006048848 | 5/2006 |
| WO | 2006080702 | 8/2006 |
| WO | 2007089550 | 8/2007 |
| WO | 2007137095 | 11/2007 |
| WO | 2008051184 | 5/2008 |
| WO | 2008112013 | 9/2008 |
| WO | 2008121970 | 10/2008 |

OTHER PUBLICATIONS

James Tyrrell, Physicists roll out nanotube paper, Mar. 3, 2008, Physicsworl.com/cws/article/news/2008/mar/03/physicists-roll-out-nanotube-paper.*
Chung, D.D.L., "Materials for Thermal Conduction", Applied Thermal Engineering 21 (2001) 1593-1605 Dec. 31, 2001.
Seaman, Christopher, et al., "Carbon Velvet Thermal Interface Gaskets", American Institute of Aeronautics & Astronautics, Paper for 39th AIAA Aerospace Sciences Meeting, Session: Spacecraft Thermal Control & Technology, Reno, Nevada, Jan. 8-11, 2001.
Tong, Tao, et al., "Vertically Aligned Multi-Walled Carbon Nanotube Arrays as Thermal Interface materials and Measurement Technique", Proceedings of IMECE2005, 2005 ASME International Mechanical Engineering Congress and Exposition Nov. 5, 2005.
Xu, Jun, et al., "Enhancement of Thermal Interface Materials with Carbon Nanotube Arrays", Inl'l. Journal of Heat & Mass Transfer 49 (2006) 1658-1666 Dec. 31, 2006.
Park, Myounggu, et al., "Effects of a Carbon Nanotube Layer on Electrical Contact Resistance Between Copper Substrates", Institute of Physics Publishing, Nanotechnology 17 (2006) 2294-2303 Dec. 31, 2006.
Xu, Jun, et al., "Enhanced Thermal Contact Conductance Using Carbon Nanotube Array Interfaces", IEEE Transactions on Components & Packaging Technologies, vol. 29, No. 2, Jun. 2006, Jun. 30, 2006.
Wang, C.Y., et al. "Flexible Field Emitter Made of Carbon Nanotubes Microwave Welded onto Polymer Substrates", Applied Physics Letters, vol. 90, 103111, (2007) Dec. 31, 2007.
Li, et al., "Highly-ordered carbon nanotube arrays for electronics applications," American Institute of Physics, vol. 75, No. 3, Jul. 1999, pp. 367-369. Jul. 30, 1999.
Yovanovich, "Effect of Foils Upon Joint Resistance: Evidence of Optimum Thickness," presented at AIAA 7th Thermophysics Conference, San Antonio, TX, Apr. 10-12, 1972.
Han, I.T. et al., "Effect of Al and catalyst thickness on the growth of carbon nanotubes and application to gated field" Chemical Physics Letters (2004 ), 400(1-3), pp. 139-144. Dec. 31, 2004.
Schmidt, B., et al., "In situ investigation of ion drift processes in glass during anodic bonding" Sensors and Actuators A 67 (1998) 191-198 Dec. 31, 1998.
Cola, Baratunde A., et al., "Photoacoustic Characterization of Carbon Nanotube Array Thermal Interfaces" J. Appl. Phys. 101, 054313 (2007) Dec. 31, 2007.
Aradha, S., et al., "Electrothermally Bonded Carbon Nanotube Interfaces" IEEE 2008 pp. 1071-1077 Dec. 31, 2008.
Bower, et al., "Plasma Induced Alignment of Carbon Nanotubes" Appl. Phys. Lett. 77 (2000) p. 830-832 Dec. 31, 2000.
Non-Final Office Action for U.S. Appl. No. 12/339,818, mailed Dec. 28, 2011, 7 pages.
Applicant Response for U.S. Appl. No. 12/339,818, filed Mar. 20, 2012, 13 pages.
Notice of Allowance for U.S. Appl. No. 12/339,818, dated Apr. 10, 2012, 7 pages.
Serial No. PCT/US2007/081667, Search Report & Written Opinion, dated Mar. 31, 2008, 8 pages.
Applicant Response to Written Opinion, Serial No. PCT/US2007/081667, filed Aug. 18, 2008, 12 pages.
Serial No. PCT/US2007/081667, IPRP, dated Apr. 1, 2010, 15 pages.
U.S. Appl. No. 12/719,759, Non-Final Office Action, mailed Jul. 24, 2012, 18 pages.
Applicant Response, U.S. Appl. No. 12/719,759, filed Nov. 24, 2012, 22 pages.
U.S. Appl. No. 12/719,759 Final Rejection Office Action, mailed Dec. 28, 2012, 19 pages.
Applicant Amendment After Final Action, U.S. Appl. No. 12/719,759, filed Mar. 28, 2013, 7 pages.
U.S. Appl. No. 12/719,759, Notice of Allowance, mailed Apr. 11, 2013, 7 pages.
U.S. Appl. No. 13/526,427, Notice of Allowance, mailed Dec. 13, 2012, 7 pages.
Authorized Officer Dong Seok Kim, KIPO, Serial No. PCT/US2012/063480, Search Report & Written Opinion, dated Mar. 27, 2013, 11 pages.
Authorized Officer Dong Seok Kim, KIPO, Serial No. PCT/US2012/059159, Search Report & Written Opinion, dated Feb. 15, 2013, 8 pages.
Serial No. 2,666,815, Examiner's Report, dated Jan. 31, 2011, 3 pages.
Applicant Response, Serial No. 2,666,815, filed Jul. 29, 2011, 4 pages.
Serial No. 2,666,815, Office Action, dated Dec. 9, 2011, 3 pages.
Applicant Amendment/Remarks After Examiner's Report for Serial No. 2,666,815, filed Jun. 8, 2012, 11 pages.
Serial No. 2,666,815, Notice of Allowance, dated Sep. 20, 2012, 1 page.
U.S. Appl. No. 11/873,952, NF Office Action mailed Apr. 28, 2011, 7 pages.
Applicant Response to Office, filed Sep. 20, 2011, U.S. Appl. No. 11/873,952, 30 pages.
U.S. Appl. No. 11/873,952, Final Action mailed Dec. 13, 2011, 15 pages.
Applicant Request for Advisory Action, filed Feb. 13, 2012, U.S. Appl. No. 11/873,952, 19 pages.
U.S. Appl. No. 11/873,952, Advisory Action mailed Feb. 23, 2012, 3 pages.
Applicant Response to Final Action, filed Mar. 23, 2012, U.S. Appl. No. 11/873,952, 18 pages.
Applicant Amendment after Final, filed Mar. 27, 2012, U.S. Appl. No. 11/873,952, 4 pages.
U.S. Appl. No. 11/873,952, Notice of Allowance mailed Apr. 13, 2012, 8 pages.
U.S. Appl. No. 11/873,952—Office Action mailed Apr. 28, 2011.
U.S. Appl. No. 11/873,952—Amd & Response to OA dated Sep. 20, 2011.
U.S. Appl. No. 11/873,952—Final Action dated Dec. 13, 2011.
U.S. Appl. No. 11/873,952—Request for Advisory Feb. 13, 2012.
U.S. Appl. No. 11/873,952—Advisory Action dated Feb. 23, 2012.
U.S. Appl. No. 11/873,952—Amendment after Final dated Mar. 23, 2012.
U.S. Appl. No. 11/873,952—Amendment after Final dated Mar. 27, 2012.
U.S. Appl. No. 11/873,952—Notice of Allowance mailed Apr. 13, 2012.

* cited by examiner

Schematic of Test Setup

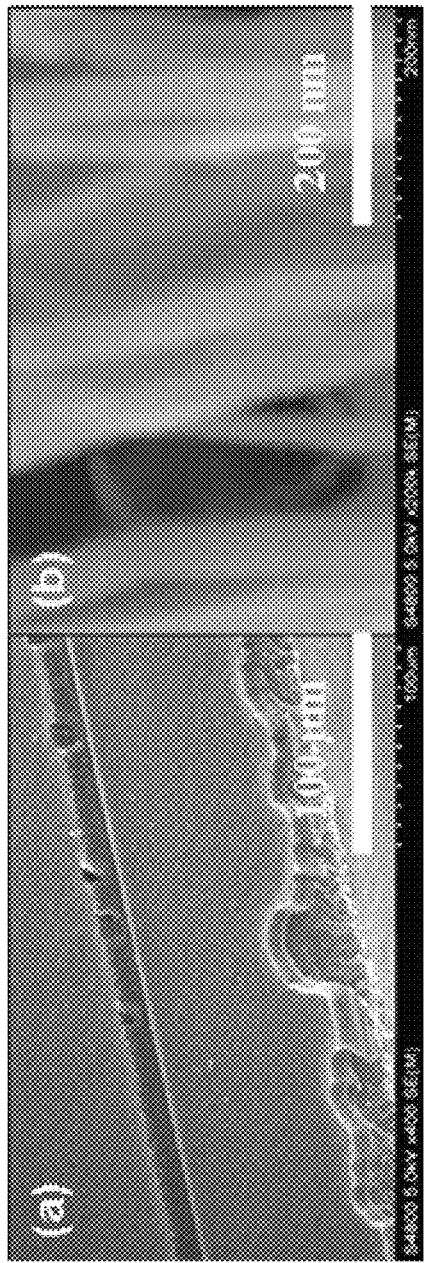
Fig. 5A
Fig. 5B
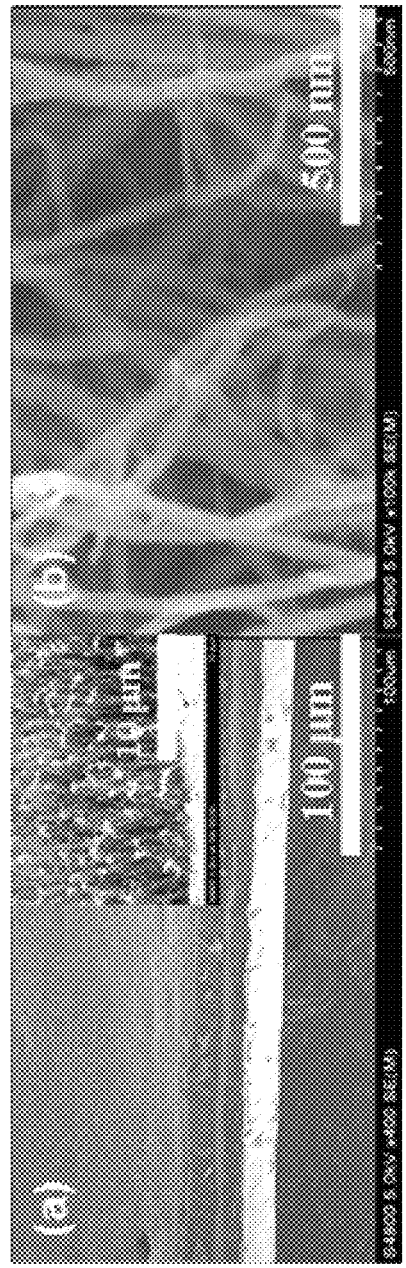
Fig. 6A
Fig. 6B

PLACE IN TRANSIENT MICROWAVE EM FIELD SO THAT THE CNT/FOIL IS PERIODICALLY HEATED SUFFICIENTLY ENOUGH TO MELT A SURFACE LAYER OF THE POLYMER. POLYMER SHOULD BE TRANSPARENT TO MICROWAVE EM WHICH ALLOWS THE HEAT TO BE CONCENTRATED AT THE INTERFACE. THE RESULTING MATERIAL SHOULD BE WELL BONDED.

BRING INTO CONTACT

Fig. 13

METHODS FOR ATTACHING CARBON NANOTUBES TO A CARBON SUBSTRATE

CROSS-REFERENCE TO RELATED APPLICATIONS

This application is a continuation-in-part of U.S. patent application Ser. No. 11/873,952, filed Oct. 17, 2007, entitled ELECTROTHERMAL INTERFACE MATERIAL ENHANCER and claims the benefit of priority to U.S. Provisional Patent Application Ser. No. 61/144,915, filed Jan. 15, 2009, entitled METHODS FOR ATTACHED CARBON NANOTUBES TO A CARBON SUBSTRATE, both of which are incorporated herein by reference.

FIELD OF THE INVENTION

This invention pertains to flexible structures having nanostructures attached to a surface, and in particular to a thermal interface including a carbon substrate.

BACKGROUND OF THE INVENTION

Electrical and thermal contacts are elements in many engineering systems and applications at the macro, micro, and nano scales. Reliability and functionality of these contacts can often be a limiting design factor. A major portion of electrical contact resistance comes from the lack of ideal mating between surfaces. Primary causes of this problem involve the mechanical properties of the surfaces and surface roughness. When two surfaces are brought together, the actual contact area may be much smaller than the apparent contact area. The contact between two surfaces can actually be thought of as the contact of several discrete points in parallel, referred to as solid spots or α-spots. Thus, the α-spots act as conductive areas and can be a small percentage of the total area.

Since their discovery, carbon nanotubes (CNTs) have been studied intensively throughout many communities in science and engineering. Several researchers have reported on the mechanical, electrical, and thermal properties of individual single-wall carbon nanotubes (SWCNTs). The electrical properties of SWCNTs are affected by the chirality of the SWCNTs to the degree that the SWCNTs can exhibit metallic or semiconducting electrical conductivity. The electrical transport properties of a single SWCNT are a well studied subject. It has been shown that for ballistic transport and perfect contacts, a SWCNT has a theoretical resistance of 6.45 K$\Omega$, which is half of the quantum resistance $h/2e^2$. In MWCNTs, each layer within the MWCNT can have either a metallic or semi-conducting band structure depending on its diameter and chirality. Due to this variation among layers, the net electrical behavior of a MWCNT is typically metallic and a wide range of resistance values, e.g., from 478$\Omega$ to 29 K$\Omega$, have been reported.

The use of an individual MWCNT or SWCNT may not be sufficient to reduce contact resistance at an interface significantly. However, by using an array of SWCNTs or MWCNTs as an interfacial layer, it is expected that numerous individual contact spots and contact area enlargement can create current flow paths through each contact, thus reducing overall resistance. An additional advantage to using CNTs is that they can tolerate high current densities. Therefore a SWCNT or MWCNT layer can be a potential solution to the reliability and functionality issues faced at electrical interfaces.

Various embodiments of the present invention present novel and nonobvious apparatus and methods for improved structural, electrical, and thermal interfaces.

SUMMARY OF THE INVENTION

One embodiment of the present invention is an apparatus used to reduce the thermal (or electrical) interface resistance between two connecting devices such as an electronic component and a heat sink, or between one electrical component and another electrical component.

The invention in one embodiment includes synthesizing CNT arrays on one or both sides of thin and highly compliant 'foil' substrates comprised of interwoven or dry adhered CNTs and/or graphite and/or other carbon-based materials. These free-standing, carbon-based substrates can be purchased commercially or fabricated through processes that are defined in the open literature. Carbon materials such as CNTs and graphite are compliant and have high axial and in-plane thermal conductivities. Because of such properties, carbon-based foil substrates combined with CNT arrays grown on one or both sides creates an apparatus that is effective in spreading heat and providing low interface resistance. The carbon-carbon interface between a CNT and the carbon-based substrate promotes efficient heat transfer and adhesion due to a gradient chemical and morphological structure.

Yet other embodiments of the present invention pertain to nanoassemblies that function as thermal interface materials (TIMs) that includes a phase change material that is wicked onto the assembly.

It will be appreciated that the various apparatus and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is excessive and unnecessary.

BRIEF DESCRIPTION OF THE DRAWINGS

FIG. 5 shows SEM images according to one embodiment of the present invention of a CNT array synthesized on a Si substrate on a silicon substrate. (a) A 30°-tilted plane, top view of the vertically oriented and dense CNT array. The array height is estimated to be 15 µm. The CNT array has a part across the top of the image that helps illustrate the uniformity of growth. (b) An image with higher magnification showing individual CNTs. CNT diameters range from 15-60 nm.

FIG. 6 shows SEM images according to one embodiment of the present invention of a CNT array synthesized on a Cu sheet according to one embodiment of the present invention. (a) Cross-section view of the vertically oriented and dense CNT array. The array height is estimated to be approximately 20 µm; the inset shows the CNT array grown on a 1 cm tall Cu bar. (b) An image with higher magnification showing individual CNTs. The CNT diameters range from 15-60 nm.

FIG. 13 is a schematic representation of an apparatus and method according to another embodiment of the present invention.

DESCRIPTION OF THE PREFERRED EMBODIMENT

Figure 1A:
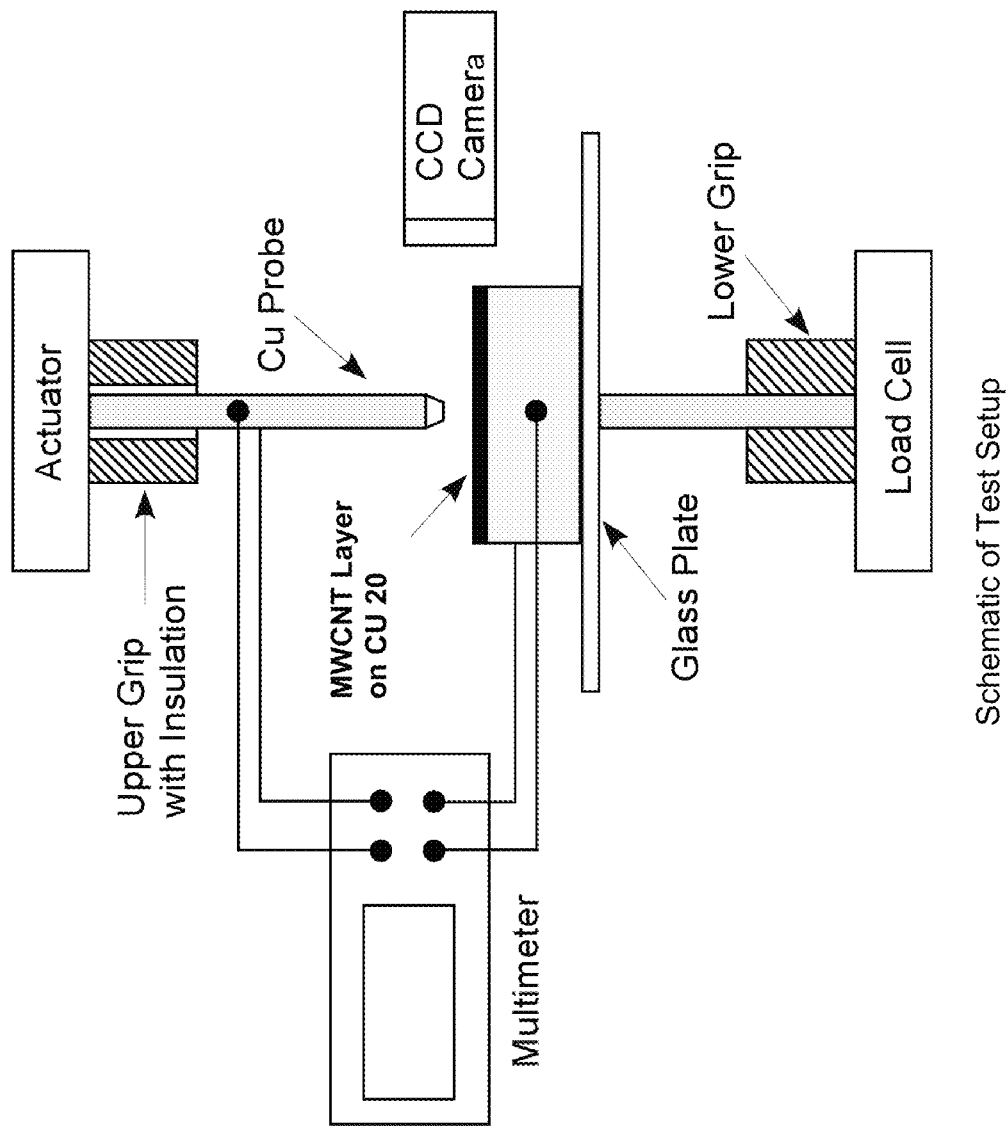
FIG. 1A is a schematic diagram of a photoacoustic (PA) test apparatus.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates. At least one embodiment of the present invention will be described and shown, and this application may show and/or describe other embodiments of the present invention. It is understood that any reference to "the invention" is a reference to an embodiment of a family of inventions, with no single embodiment including an apparatus, process, or composition that must be included in all embodiments, unless otherwise stated.

The use of an N-series prefix for an element number (NXX.XX) refers to an element that is the same as the non-prefixed element (XX.XX), except as shown and described thereafter. As an example, an element 1020.1 would be the same as element 20.1, except for those different features of element 1020.1 shown and described. Further, common elements and common features of related elements are drawn in the same manner in different figures, and/or use the same symbology in different figures. As such, it is not necessary to describe the features of 1020.1 and 20.1 that are the same, since these common features are apparent to a person of ordinary skill in the related field of technology. Although various specific quantities (spatial dimensions, temperatures, pressures, times, force, resistance, current, voltage, concentrations, wavelengths, frequencies, heat transfer coefficients, dimensionless parameters, etc.) may be stated herein, such specific quantities are presented as examples only. Further, with discussion pertaining to a specific composition of matter, that description is by example only, and does not limit the applicability of other species of that composition, nor does it limit the applicability of other compositions unrelated to the cited composition.

Some embodiments of the present invention pertains to nanoparticles that are deposited on at least one side of a flexible, easily deformable substrate. The substrate with attached nanoparticles can then be placed in contact with the interface of a device. The easily deformable substrate permits the substrate and nanoparticles to closely conform to irregularities on the surface of the object. By virtue of this intimate contact of the nanoparticles with the object, an interface is formed with improved properties due to the presence of the nanoparticles and an apparatus prepared according to various embodiments of the present invention include improvements in one, some, or all of the following properties: increased thermal conductance, reduced electrical resistance, absorption of electromagnetic radiation, increased efficiency in converting electromagnetic radiation to heat, and mechanical support. This list of properties provided by the nanoparticles is by way of example only, and is not an exhaustive list.

In one embodiment of the present invention, a plurality of thermally conductive nanoparticles are grown or otherwise adhered to a thin, readily deformable substrate, such as a flexible sheet of any solid material, including a foil of metal, and further including foil of noble metal, and further including carbon substrates (such as those produced from compressed graphite or graphene, exfoliated graphite, and bucky paper). The side of the substrate or foil with nanoparticles is placed in contact with a heat source, such as a package containing an integrated circuit. Because of their small size and the easy deformation of the foil, the nanoparticles readily occupy many surface irregularities of the package. Thus, the heat transmitted through the wall of the package is more effectively spread into the foil. The heat transfer to the foil can be removed by convection or by phase change if a phase change material is placed in contact with the nanoparticles, or if another object is placed in contact with the foil, through conduction.

One embodiment of the present invention includes a CNT thermal interface material (TIM) with CNT arrays directly synthesized on both sides of carbon-based 'foils' such as woven CNT films or compressed exfoliated graphite to form a nanoassembly or thermal interface assembly. Such an apparatus eliminates the need for exposing temperature sensitive materials and devices to normal CNT growth conditions (~900° C.) and provides greater conformability to rough interfaces due to the carbon foils ability to match to the interface geometry. The carbon foils also spread heat and effectively integrate a heat spreader into the assembled thermal interface material.

In another embodiment of the present invention, nanoparticles are placed on both sides of a substrate that is plastically deformable with small amounts of pressure. In one embodiment, this member is placed inbetween a source of heat and a sink for heat, such as between an integrated circuit package and a finned heat exchanger. Since the member plastically deforms under light pressure, it readily adapts to irregularities on the adjacent surfaces of the integrated circuit package and finned heat exchanger. Further, the nanoparticles will fill in some surface voids and small irregularities and any adjacent surface. Therefore, heat is more effectively transferred out of the heat source and more effectively transferred into the heat sink.

In some embodiments, the nanoparticles are multiwalled carbon nanotubes (MWCNTs) or single walled carbon nanotubes (SWCNTs). Although an individual MWCNT has an electrical resistance measured in thousands of ohms, by arranging a high density of MWCNTs on surface of the member, the overall resistance is reduced, since the MWCNTs act as resistances in parallel.

In yet other embodiments of the present invention, the MWCNTs are exposed to an electromagnetic field that preferentially aligns the MWCNTs during deposition and formation. In one embodiment, the MWCNTs are arranged such that the central axes of the tubes are substantially perpendicular to the surface to which they are attached. However, the present invention is not so limited and contemplates other directions of alignment.

In yet another embodiment, a plurality of nanoparticles is deposited on a thin, metallic, easily deformable substrate and used as a shield from electromagnetic interference (EMI). This member can be placed at the mating interface between electrical components or housings. As one example, an electrically conductive metallic foil having a plurality of vertically aligned MWCNTs on opposing sides is placed between a lid of an electronics housing and the base of the electronics housing. This foil easily conforms to irregularities in the adjoining surfaces, and both: (1) enhances the housing's blockage of external and internal EMI; and (2) reduces the electrical resistance between the lid and the base.

In yet another embodiment, the ability of MWCNTs to convert electromagnetic energy to heat is utilized to provide localized heating of a component subjected to an electromagnetic field. As one example, a member populated with MWCNTs can be placed at an interface where two thermosetting plastic materials come into contact. When the assembly of the plastic materials and nanopopulated member is subjected to a microwave field, the MWCNTs cause the thermoset joint to heat and fuse into a structural joint.

In one embodiment of the invention there is a product to be used to reduce the thermal (electrical) interface resistance between two connecting devices such as an electronic component and a heat sink (another electrical component). The embodiment includes a metal foil with dense carbon nanotube (CNT) arrays directly synthesized on the surface of both sides. Under moderate applied pressure, the metal foil deforms to the shape of the interface and the CNTs act to produce a plurality of thermally (electrically) conductive surface to surface contact spots which in effect increases the real contact area in the interface and reduces the resistance of the interface to heat conduction and electrical flow. The embodiment can also be used with existing commercial, wax-based phase change materials (PCM) to enhance the stability of the PCM in the interface and to produce increased thermal conduction through the PCM.

Various embodiments of the present invention pertain to an apparatus that can be inserted, with or without the addition of a phase change material, between a processor chip or an integrated circuit (IC) device and a heat sink to allow the chips or IC devices to operate at lower temperatures.

Various embodiments of the present invention pertain to an apparatus that can be inserted between an electrical device and a connecting electrical device to allow electricity to pass between the devices with lowered resistance.

Various embodiments of the present invention produce a thermal and or electrical interface resistance lower than other removable interface materials. The embodiment does not require CNT synthesis on the devices to be interfaced, which allows for scalable production and implementation with existing thermal (electrical) systems. When used without the PCM the embodiment of the invention is dry so it will be stable in the interface over continued use. When used with the PCM the embodiment of the invention acts to hold the PCM in the interface, increasing the stability of the PCM in the interface while enhancing thermal conduction through the PCM.

In some embodiments, dense CNT arrays are directly synthesized on both sides of metal foil to form a material that is dry, highly conductive, and conformal to an interface. In yet other embodiments, wax based phase change material is combined with the CNT arrays on the foil which enhances the thermal conductivity of the wax and discourages the wax from running out of the interface in its liquid phase. The enhancement of CNT arrays can be added to any existing interface without the need to synthesize CNTs on the interfaced devices (which can be destroyed by the temperatures required for CNT growth and limits scalability).

Figure 1B:
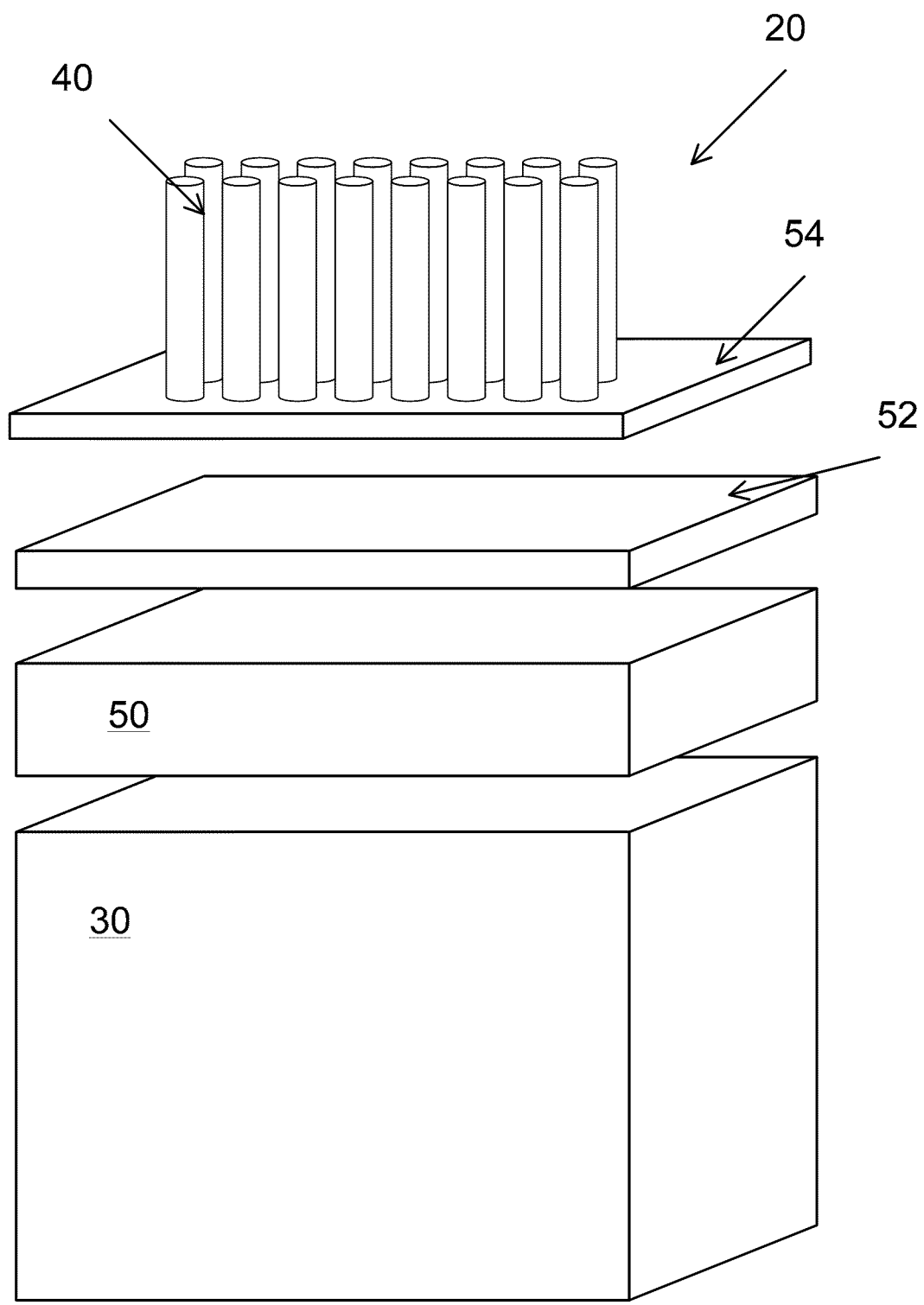
FIG. 1B is a schematic representation of a nanoparticle assembly according to one embodiment of the present invention.

Referring to FIG. 1B, a nanoparticle assembly 20 is shown according to one embodiment of the present invention and fabricated with three metal layers 50, 52, and 54, including Ti, Al, and Ni, respectively, (thickness: 30 nm, 10 nm, and 6 nm respectively) deposited on the one side of a copper substrate 30 using electron-beam evaporation. Preferably, assembly 20 is adapted and configured to be easily separable as an assembly, such that it can be handled as a separate component. The Ti layer 50 promotes adhesion of MWCNT 40 to the copper substrate 30. The Al layer 52 acts as a "buffer" layer to enhance the CNT growth with the Ni catalyst 54 that provides seed sites for CNT growth.

Although various materials are described herein, the present invention also contemplates usage of other materials. For example, some embodiments of the present invention utilize a central substrate comprising at least in part aluminum, platinum, gold, nickel, iron, tin, lead, silver, titanium, indium, or copper. Further, yet other embodiments of the present invention comprise the use of an adhesive layer comprising at least in part titanium or chromium. Yet other embodiments of the present invention include a buffer material comprising at least in part aluminum, indium, lead, or tin. Yet other embodiments of the present invention utilize a catalyst layer 54 comprising cobalt, iron, nickel, or palladium.

The CNTs were grown on this substrate surface by a microwave plasma enhanced chemical vapor deposition (PECVD) process. The feed gases were $H_2$ and $CH_4$. The flow rates of $H_2$ and $CH_4$ were 72 and 8 sccm respectively. The $H_2$ plasma was maintained under a microwave power of 150 W. The process temperature was 800° C., and the growth time was 20 min.

Figure 1C:
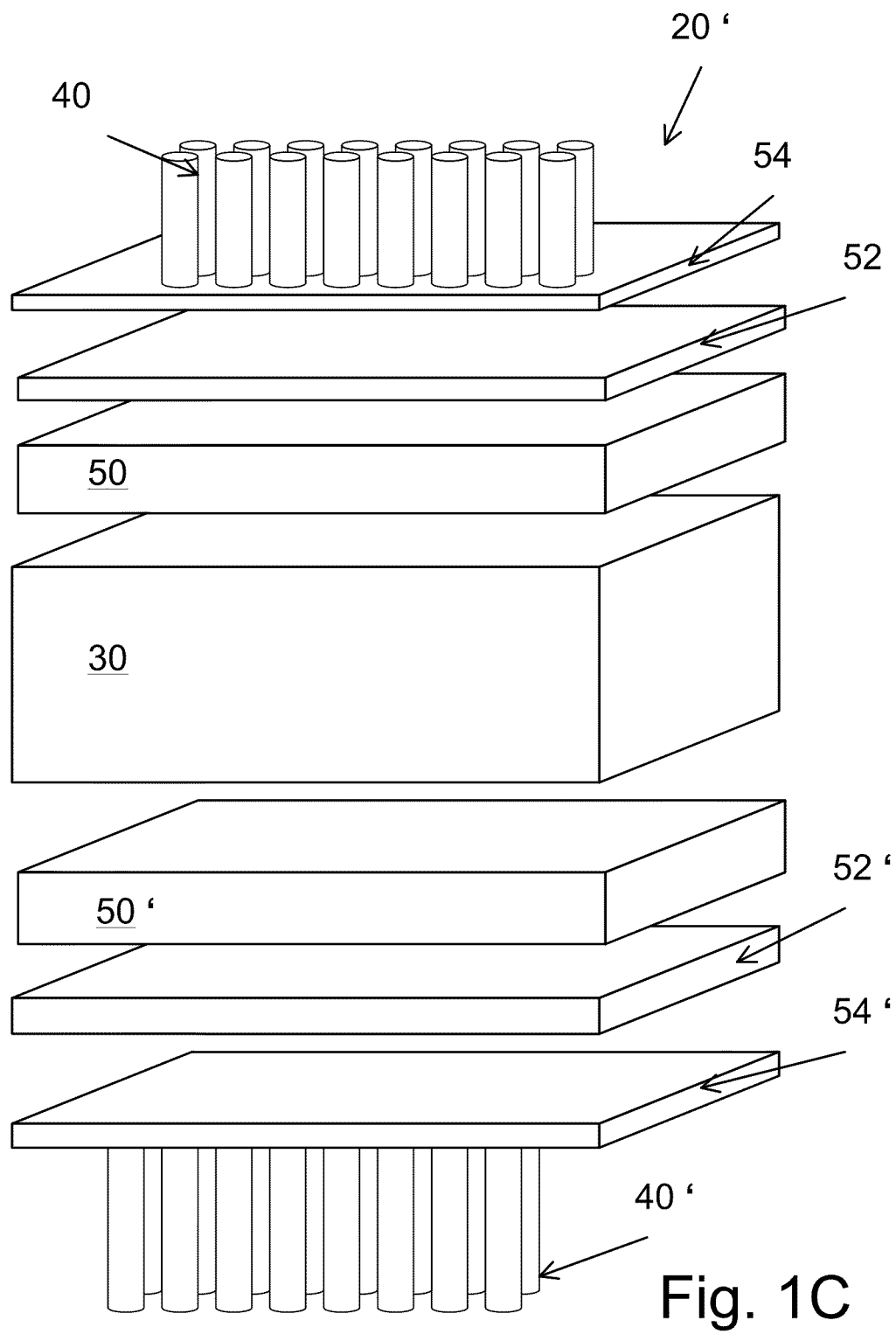
FIG. 1C is a schematic representation of a nanoparticle assembly according to another embodiment of the present invention.

Referring to FIG. 1C, a nanoparticle assembly 20' is shown according to another embodiment of the present invention. Assembly 20' includes the nanoparticle assembly 20 previously described, and includes a mirror image structure on the opposite side of central substrate 30'. Central substrate 30' further includes an adhesive layer 50' to promote adhesion of the CNTs to substrate 30'. A buffer layer 52' of aluminum is deposited on adhesive layer 50. A catalyst layer 54' is deposited on buffer layer 52'. A plurality 40' of carbon nanotubes are grown from catalytic layer 54'.

A schematic of a resistance measurement test setup is shown in FIG. 1A. While subjecting the MWCNT-enhanced Cu substrate 30 to compressive loading using a Cu probe, electrical resistance change was monitored by a multimeter (Hewlett Packard 3478A). To precisely measure small resistance changes, a four wire (point) measurement scheme was adopted. This method eliminates wire connection resistance and thereby permits contact resistance measurement at the interface. The probe material was also chosen to be Cu in order to match the properties of the Cu substrate. The probe tip area is much smaller in dimension than the substrate so that multiple measurements can be made with each specimen by changing the probing location. To make the probe, the end of a copper nail was polished flat using a polisher (Buheler ECOMET V) and $Al_2O_3$ powder (size: 9 to 1 µm). The polished copper probe tip was observed by optical microscope (Olympus BX60), and the image was digitized using software (Golden Software Diger 2.01) to measure the apparent surface area of the probe tip to be 0.31 $mm^2$.

A small-scale mechanical testing machine (Bose Endura ELF 3200) was used to control the probe displacement and to measure the interaction force between the probe and MWCNT-enhanced Cu substrate surface. The position of the probe tip was adjusted toward the sample surface while monitoring the position of the probe tip through a CCD camera. Starting from this non-contacting position (infinite electrical resistance) the probe was displaced downward slowly in 1.0 µm increments until first measurable electrical resistance was observed. This location was set to be the initial position (Z=0 µm) of the probe, and the probe tip was subsequently moved downward by 1.0 µm increments. At each step of displacement, contact resistance and force data were recorded. When the resistance displayed a trend close to a constant value, the probe descent was stopped. The probe was then moved upward (reverse direction) in 1.0 µm increments while measuring the contact resistance and force until electrical contact was lost (infinite resistance).

The measurements were conducted at two different locations on the same specimen surface, referred to as Test 1 and Test 2. The resistance ranged from a maximum value of $10^8 \Omega$ to a minimum value of $4\Omega$. As the probe was lowered, resistance decreased.

In Test 1, the position corresponding to the first finite resistance value is identified as initial electrical contact position (Z=0 µm). The resistance did not change significantly until the probe moved downward past Z=7 µm. At Z=11 µm, the first measurable reaction force was observed. The electrical resistance then reduced significantly to a steady value of $4\Omega$ with increased probe movement. Note that between the initial position (Z=0 µm) and Z=11 µm, there was no measurable force but electrical contact was maintained (finite resistance was measured).

In Test 2, the distance between the initial position (Z=0 µm) and the first measurable force position (Z=18 µm) is longer than that of Test 1. This can be attributed to the resolution limits of the load cell and contact characteristics between the probe and MWCNT layer. In the beginning of contact, a relatively smaller number of MWCNT touch the probe tip and thus the force is in the range below the 0.001 N resolution of the load cell.

Resistance measured while the probe moved upward (reverse process) for the first several steps (from Z=20 µm to Z=14 µm for Test 1 and from Z=28 µm to Z=24 µm for Test 2) showed similar or slightly higher values at corresponding positions of the downward measurement. However, the resistance did not increase to an infinite value when the probe passed the position from where contact force between two surfaces dropped to zero (Z=13 µm for Test 1 and Z=23 µm for Test 2). Electrical contact is maintained even past the initial position (Z=0 µm), up to Z=−7 µm for Test 1 and to Z=−1 µm for Test 2. This trend is opposite to that observed for the bare Cu—Cu contact. Also, step-like features of resistance change are evident during both downward and upward movements of the probe. These features are thought to be the result of van der Waals forces.

The overall trend of force change is more linear than the control case. The average stiffness during downward movement (0.173×10⁶ N/m for Test 1 and 0.123×10⁶ N/m for Test 2) is approximately two times higher than the initial stiffness of the bare Cu—Cu contact (0.067×10⁶ N/m).

Figure 2:
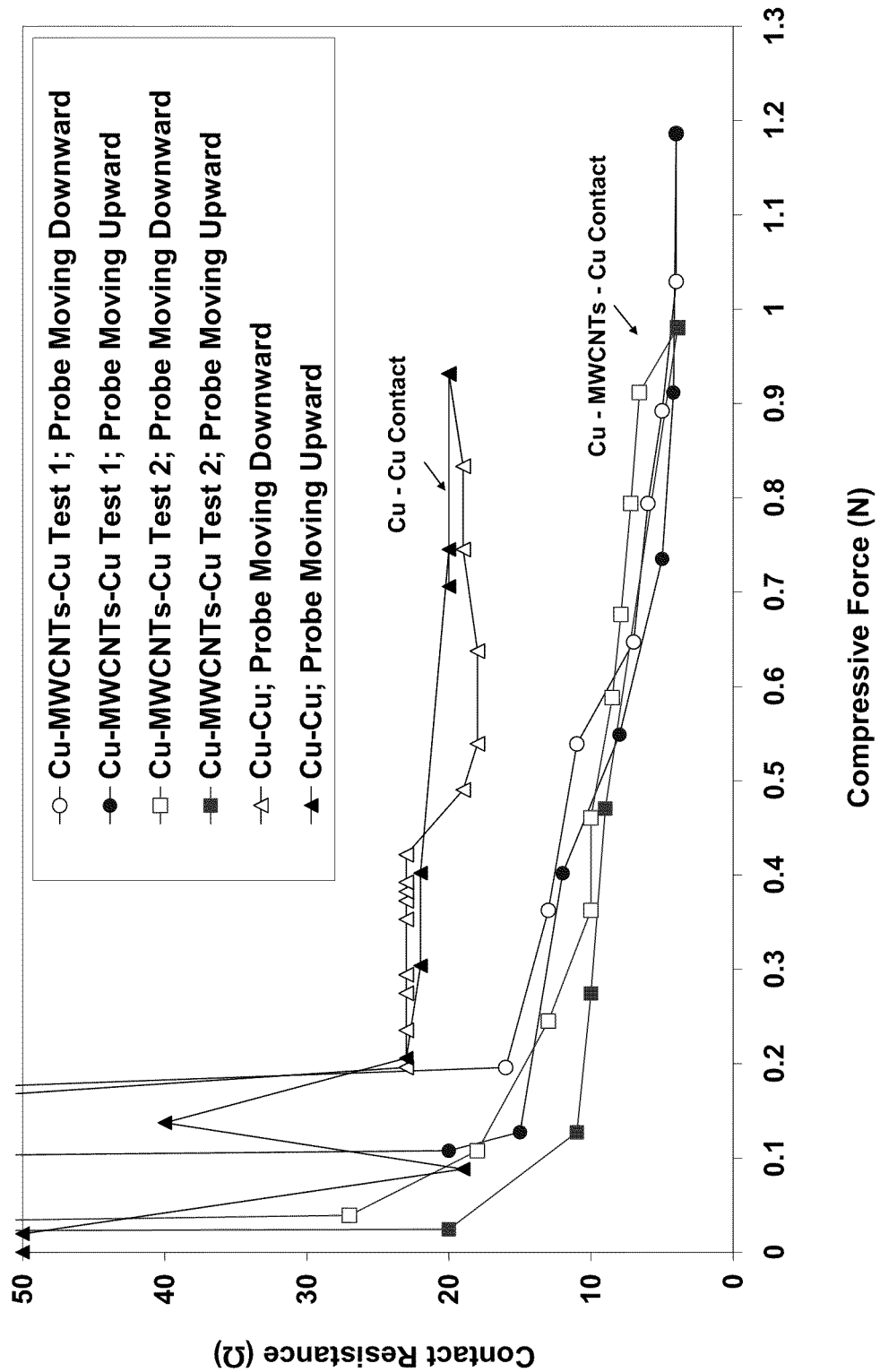
FIG. 2 is a comparison of contact resistance between a bare Cu—Cu Interface and a Cu-MWCNT-Cu Interface.

The differences in the measured resistance and force between Test 1 and Test 2 are attributed to the global-scale variations of the MWCNT layer. The density and morphology of the MWCNT layer generally varies at different probing locations. Also the sensitivity of the electrical resistance measurements affects how one defines the initial electrical contact position. However, after the probe registers a measurable force, the trends of contact resistance versus force for both tests are found to closely overlap each other, as shown in FIG. 2.

From the previous results, it is clear that the MWCNT layer played a role reducing electrical resistance and increasing stiffness. A comparison of the bare Cu—Cu contact and the Cu-MWCNT-Cu contact is shown in FIG. 2. For the same apparent contact area the Cu-MWCNT-Cu interface showed a minimum resistance of 4Ω while the Cu—Cu interface showed a minimum resistance of 20Ω. An 80% reduction in resistance was observed under small compressive loading when MWCNTs are used as an interfacial material between Cu surfaces. The average stiffness of the Cu-MWCNT-Cu contact is approximately two times larger than that of the bare Cu—Cu contact.

Figure 3:
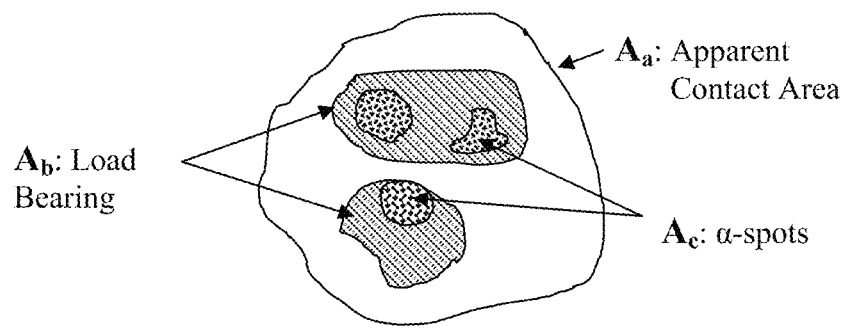
FIG. 3 depicts a classification of the Contact Surface.
Figure 4A:
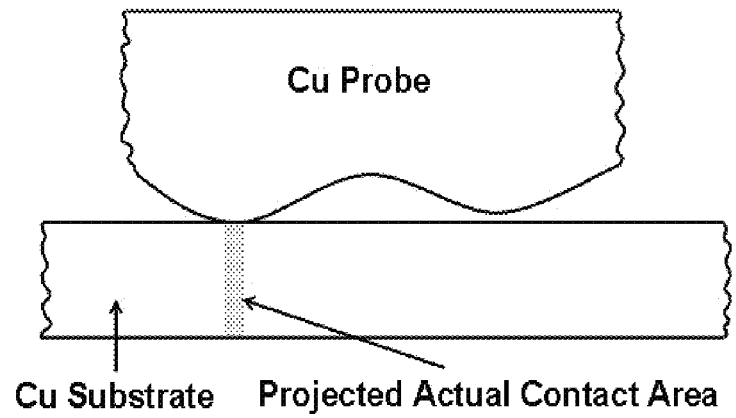
FIG. 4a is a typical contact configuration of a bare Cu—Cu contact.
Figure 4B:
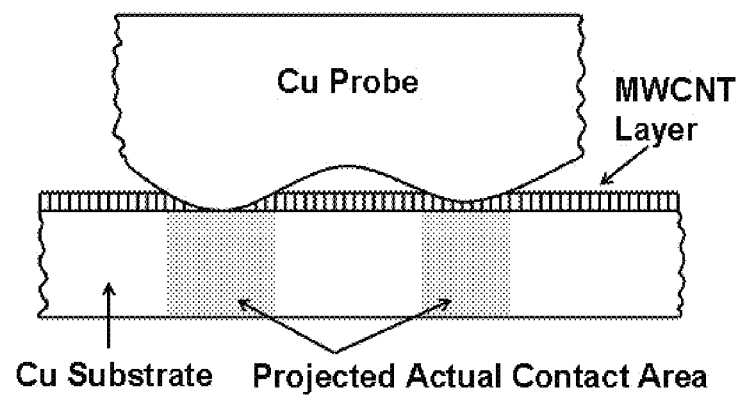
FIG. 4b shows a contact resistance reduction by parallel contacts created by MWCNTs according to one embodiment of the present invention.

The mechanism of contact resistance reduction due to the presence of the MWCNT layer 40 can be explained by two phenomena: (i) enlargement of real contact area through numerous parallel contacts, (ii) electrical junctions between CNTs combined with compressive loading. Although CNTs can carry large current densities, it is known that by simply placing a single CNT on a metal electrode, the contact resistance was observed to be in the $10^3 \Omega$ to $10^6 \Omega$ range. Also the minimum resistance between a single CNT and a metal contact can be on the order of $10^3 \Omega$. However macroscopic contact resistance can be reduced by using a MWCNT layer containing numerous individual MWCNTs that create parallel paths. Note that a portion of the apparent contact surface which is indicated as $A_c$ (α-spots) in FIG. 3 participates in electrical conduction. In the case of the Cu-MWCNT-Cu contact, CNTs increase the size of $A_c$ (α-spots). While this contact situation is complicated, it can be simplified conceptually. As depicted in FIG. 4, the gap between two contacting members (see FIG. 4a) is filled with MWCNTs thereby increasing the contact area (see FIG. 4b) via numerous parallel electrical contact paths.

Resistance reduction is also possible though electrical junctions made between CNTs. The MWCNTs on the substrate's surface exhibit a random configuration with no preferential direction. These create electrical junctions among adjacent CNTs to reduce the contact resistance. Other researchers suggest that contact resistance vary widely depending upon the relative orientation of two CNT surfaces and the level of compressive loading on the junction. When two contacting CNTs are in the A-A configuration it is called "in registry" which exhibits lower contact resistance than the A-B configuration ("out of registry"). For example, in the case of an "in registry" junction, the resistance is 2.05 MΩ for rigid tubes. If compressive force is applied on this junction, the resistance is reduced to 121 KΩ. In real cases, the junction resistance likely falls between the lower and the higher resistances. Therefore it is believed that the ensemble of the numerous contacts and junctions created during the probe movement dictate the macroscopic contact resistance.

For the Cu-MWCNT-Cu interface, the force increased almost linearly when the Cu probe moved downward. However for the bare Cu—Cu contact, the force did not increase in a steady manner and was less than that of the Cu-MWCNT-Cu contact. Note that if the load bearing area is increased, then the force will increase accordingly. Thus it can be concluded that MWCNT layer is also effective in enlarging the load bearing area.

In yet another embodiment of the present invention, CNT array samples were grown on Si ($R_a$=0.01 μm and $R_z$=0.09 μm, calculated by ASME B46.1-2002) and Cu ($R_a$=0.05 μm and $R_z$=0.5 μm, calculated by ASME B46.1-2002) surfaces with a tri-layer (Ti/Al/Ni) catalyst configuration by direct synthesis with microwave plasma-enhanced chemical vapor deposition (PECVD) employing $H_2$ and $CH_4$ feed gasses. Si and Cu were chosen as growth substrates in order to assemble an interface that is representative of a common heat sink-processor chip interface. Similar to the work of Xu and Fisher, the thicknesses of Ti, Al, and Ni metal layers were 30 nm, 10 nm, and 6 nm respectively. The working pressure of the PECVD chamber was 10 torr, the sample stage temperature was 800° C., and the microwave plasma power was 150 W. The volumetric flow rates of $H_2$ and $CH_4$ were 72 sccm and 8 sccm respectively, and the growth period was approximately 20 minutes.

FIG. 5a shows a 30°-tilted plane, top view of the CNT array synthesized on Si. The array height is approximately 15 μm. CNT diameters for the array on the Si wafer range from 15-60 nm (FIG. 5b). FIG. 6 shows that, with identical catalyst preparation, the CNT array synthesized on a Cu sheet is similar to the array on the Si wafer. The array height is approximately 20 μm (FIG. 6a), and the CNT diameters also range from 15-60 nm (FIG. 6b).

A CNT array was grown on a Cu block, which protruded into the plasma and had sharp edges, in a prior study (inset of FIG. 6a). The block acted like an antenna to concentrate the plasma energy around its corners and edges. This plasma concentration had a strong etching effect on the CNT growth surface. By comparison, the height and density of the array on the Cu sheet is improved because the plasma did not concentrate on the sheet during CNT growth.

The CNT density, determined by counting CNTs in a representative area of a scanning electron microscope (SEM) image, was approximately $6 \times 10^8$ CNT/mm². Assuming an average CNT diameter of approximately 30 nm, an approximate CNT volume fraction of 42% can be calculated by assuming the CNTs are circular tubes of uniform height that are packed in vertical alignment. Some embodiments of the present invention contemplate volume fractions of about 30 percent to 50 percent. Considering the lower porosities in comparison with fullerenes, multi-walled CNTs should possess a mass density between that of fullerenes, 1900 kg/m³ and graphite, 2210 kg/m³. Thus, by assuming a multi-walled CNT mass density of approximately 2060 kg/m³, the effective mass density of all the CNT arrays (including effects of void space) in this work is estimated to be approximately 865 kg/m³.

For some of the test specimens prepared according to one embodiment of the present invention, a photoacoustic technique was used to measure resistance. In photoacoustic (PA) measurements a heating source, normally a laser beam, is periodically irradiated on a sample surface. The acoustic response of the gas above the sample is measured and related to the thermal properties of the sample. The PA phenomenon was first explained by Rosencwaig and Gersho, and an analytic solution of the PA response of a single layer on a substrate was developed. A more general analytic solution derived by Hu et al. that explains the PA effect in multilayered materials is used in this study. A review of the PA technique was given by Tam, and the technique has been used successfully to obtain the thermal conductivity of thin films. The PA technique has also been used to measure the resistance of atomically bonded interfaces, for which resistances were orders of magnitude less than the resistances measured in this study. The use of the PA technique for the measurement of thermal resistance of separable (non-bonded) interfaces has not been found in the literature. Also, the use of the PA technique with a pressurized acoustic chamber and sample has not been found in the literature.

Figure 7:
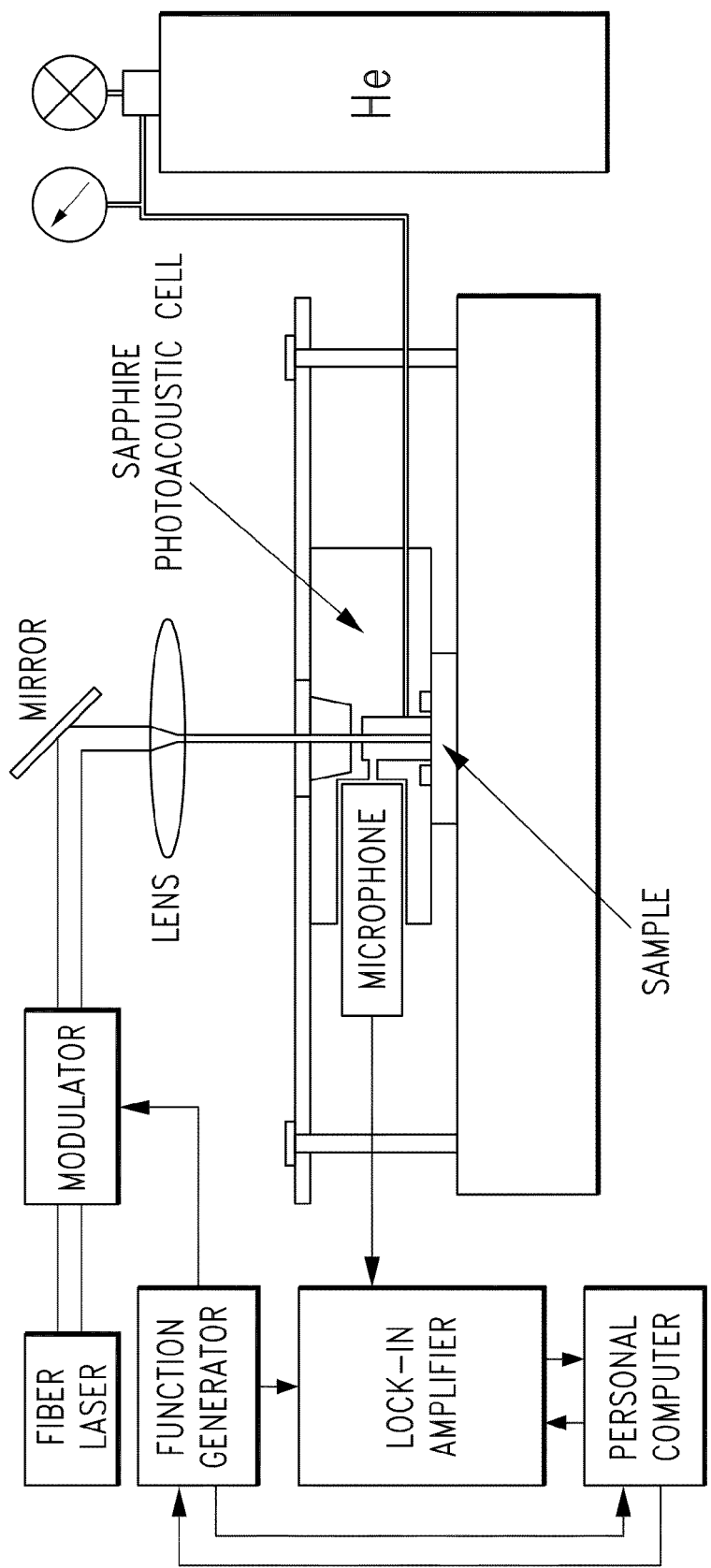
FIG. 7 is a schematic representation of a system for preparing apparatus according to one embodiment of the present invention.

A schematic of the experimental setup is shown in FIG. 7. A fiber laser operating at a wavelength of 1.1 µm is used as the heating source. Laser power is sinusoidally modulated by an acoustic-optical modulator driven by a function generator. For this study, the modulation frequency ranges from 300-750 Hz. The output power of the laser is approximately 350 mW in the modulation mode. After being reflected and focused, the laser beam is directed onto the sample mounted at the bottom of the PA cell. The PA cell is pressurized by flowing compressed He as shown in FIG. 7, thus providing a uniform average pressure on the sample surface. The PA cell pressure is adjusted using a flow controller and is measured by a gauge attached to the flow line. The test pressures are chosen to span a range of pressures commonly applied to promote contact between a heat sink and a processor chip. A microphone, which is built into the PA cell, senses the acoustic signal and transfers it to a lock-in amplifier, where the amplitude and phase of the acoustic signal are measured. A personal computer, which is connected to the GPIB interface of the lock-in amplifier and function generator, is used for data acquisition and control of the experiment.

Figure 8:
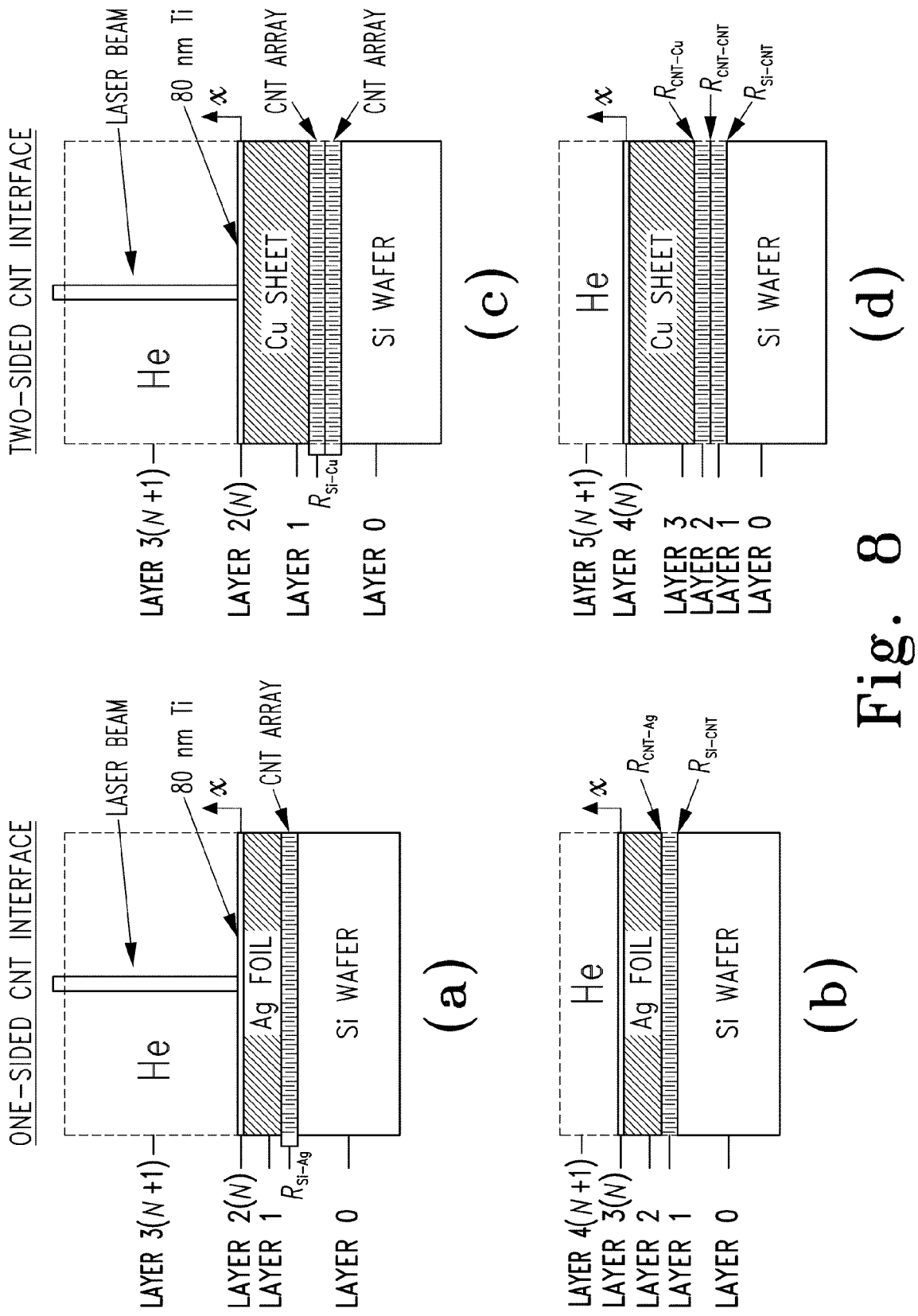
FIG. 8 is a schematic representation of different analytical models of the inventive sample assemblies during PA measurement. (a) The CNT array is not considered a layer in the PA model, but rather as a contributor to the interface resistance between the Si wafer and the Ag foil, $R_{Si—Ag}$. (b) The CNT array is considered a layer in the PA model; therefore, the component resistances, $R_{Si-CNT}$ and $R_{CNT-Ag}$, and the thermal diffusivity of the CNT array can be estimated. (c) The CNT arrays are not considered as layers in the PA model, but rather as contributors to the interface resistance between the Si wafer and the Cu sheet, $R_{Si—Cu}$. (d) The CNT arrays are considered as layers in the PA model; therefore, the component resistances, $R_{Si-CNT}$, $R_{CNT-CNT}$, and $R_{CNT-Cu}$, and the thermal diffusivity of each CNT array can be estimated.

For the one-sided CNT interface prepared according to one embodiment of the present invention, Ag foil ($R_a$=0.06 µm and $R_z$=0.4 µm, calculated by ASME B46.1-2002) forms the top of the sample, while for the two-sided CNT interface according to another embodiment of the present invention the side of the Cu sheet not coated by the CNT array is the effective top of the sample. The sample structures according to various embodiments of the present invention are shown schematically in FIG. 8. To prepare the samples for PA measurements, an 80 nm top layer of Ti was deposited by electron beam deposition, thus allowing for the Ti film to absorb the same amount of laser energy as the Ti film on the reference sample during measurements. The Ag foil (hard, Premion® 99.998% (metals basis); Alfa Aesar, Inc.) was 25 µm thick, and the Cu sheet (Puratronic® 99.9999% (metals basis); Alfa Aesar, Inc.) was 50 µm thick to allow for high sensitivity to the total interface resistance of the one-sided and two-sided CNT interfaces, respectively. The Si wafers (double-side polished and <1 0 0> orientation; Universitywafer.com) were 565 µm thick to ensure that the layer is thermally thick. Although particular thicknesses of silver and copper foil for the substrate have been shown and described, the present invention is not so limited, and contemplates the use of foil as thick as about 0.1 millimeters. Further, although various purities of silver and copper have been described, the present invention is not so constrained and contemplates the use of foils with more impurities that are cheaper and more commercially available.

The one-sided CNT interface sample has an upper and lower measurement limit of ~100 mm$^2$·K/W and ~0.1 mm$^2$·K/W, respectively. The two-sided CNT interface sample has an upper and lower measurement limit of ~35 mm$^2$·K/W and ~0.4 mm$^2$·K/W respectively. The use of the hard, 25 µm-thick µg foil in the one-sided CNT sample instead of the 50 µm-thick Cu sheet allows for greater measurement sensitivity to the expected interface resistance values. Cu sheets less than 50 µm thick can improve measurement sensitivity as well; however, reduction in interface resistance resulting from the sheet's surface conformability (deformation between asperities) are to be carefully considered in such a case.

In general, the range of measurable resistances expands as the ratio of the thermal penetration depth to thickness increases for the top substrate (Ag and Cu in this work). The upper measurement limit results when the sample's effective thermal penetration depth is insufficient for allowing heat to pass through the interface and into the Si substrate; in this limit the interface is thermally thick. The lower measurement limit results when the sample's effective thermal penetration depth is much larger than the 'resistive thickness' of the interface; in this limit the interface is thermally thin. For the frequency range and sample configurations of this study a 1-D heat diffusion analysis is applicable because the largest in-plane thermal diffusion length in the layered one-sided CNT sample, $1/a_{Ag}$=0.43 mm, and two-sided CNT sample, $1/a_{Cu}$=0.35 mm, are much less than the laser beam size (approximately 1 mm×2 mm).[37]

A reference or calibration sample is used for PA measurements in order to characterize signal delay due to the time needed for the acoustic wave to travel from the sample surface to the microphone and acoustic resonance in the cell (resonance was not experienced for the cell in the frequency range of this study). A 565 µm-thick Si wafer with a top 80 nm layer of Ti, deposited by electron beam deposition, was used as the reference sample (for uniformity, Ti was deposited on the reference and test samples at the same time).

The reference was tested with the PA cell pressurized at different levels, including the pressure levels at which the samples were tested. According to PA theory, phase shift is independent of cell pressure, while amplitude is proportional to cell pressure. However, the signal delay may be pressure-dependent for both phase shift and amplitude. The composition of the cell gas can change the nature of the cell signal delay as well. Air, $N_2$, and He were observed to cause different signal delay responses. Of these gases, He produced the highest signal to noise ratio, which is expected because the thermal conductivity of He is approximately an order of magnitude higher than that of air or $N_2$. He was therefore used as the cell gas for this work. The thermal diffusion length in the He filled PA cell, $1/a_{He}$=0.46 mm (at atmospheric pressure), is much less than the PA cell radius (4 mm) which supports the assumptions of the PA model.

Using the PA technique, the thermal resistance of a one-sided CNT interface (Si-CNT-Ag) has been measured at 0.241 MPa, and the thermal resistance of a two-sided CNT interface (Si-CNT-CNT-Cu) has been measured as a function of pressure. The PA technique has also been used to measure the component resistances of the CNT interfaces and the thermal diffusivities of the CNT arrays. All CNT interface measurements were performed at room temperature. After testing, the interfaces were separated, and the CNT coverage on the Cu and Si substrates was observed visually to match the pre-test condition. This resiliency is the result of the strong anchoring of the arrays to their substrates enabled by the tri-layer catalyst.

Figure 9:
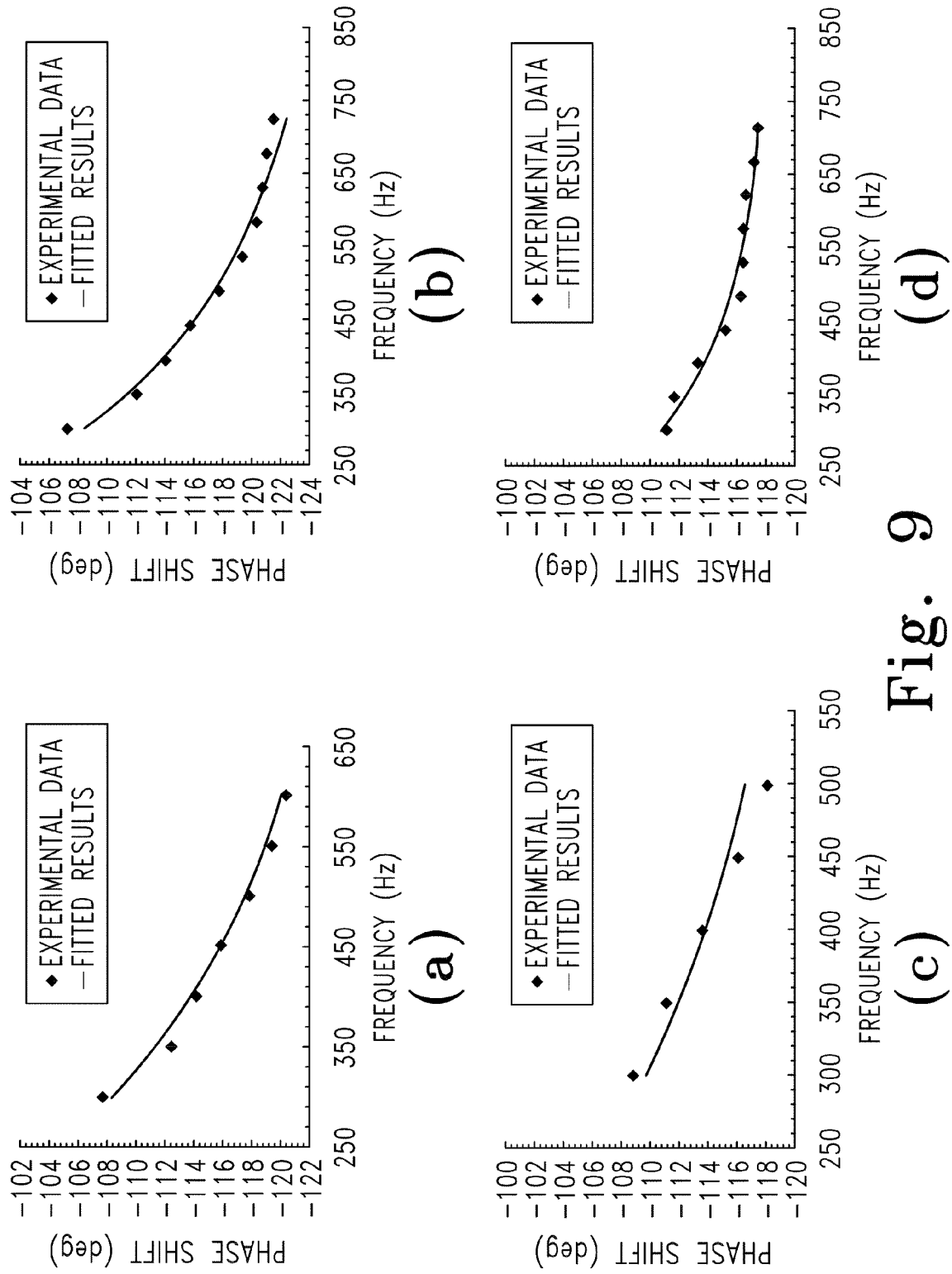
FIG. 9 show phase shift as a function of modulation frequency for CNT interfaces under 0.241 MPa of pressure. (a) Lumped one-sided interface fitting results. The mean-square deviation is 0.5° in phase shift. (b) Resolved one-sided interface fitting results. The mean-square deviation is 0.5° in phase shift. (c) Lumped two-sided interface fitting results. The mean-square deviation is 0.9° in phase shift. (d) Resolved two-sided interface fitting results. The mean-square deviation is 0.3° in phase shift. The two-sided fitting data is typical of measurements at each pressure.

FIG. 9 illustrates the fitted phase shift results at 0.241 MPa for the CNT interface samples. FIGS. 9a, 9b, 9c, and 9d, correspond to FIGS. 8a, 8b, 8c, and 8d, respectively. To establish a benchmark for the accuracy of the PA technique, a commercial PCM (Shin-Etsu 25×25 mm thermal pad; Shin-Etsu Chemical Co., Ltd.) interface (Si-PCM-Cu) was tested.

The PCM changes phase at 48° C. and has a reported resistance of 22 mm²·K/W for a 50 μm-thick layer. A resistance of 20 mm²·K/W was measured with the PA technique for an approximate interface temperature of 55° C. and pressure of 0.138 MPa, which is in good agreement with the manufacturer's published value.

Figure 10:
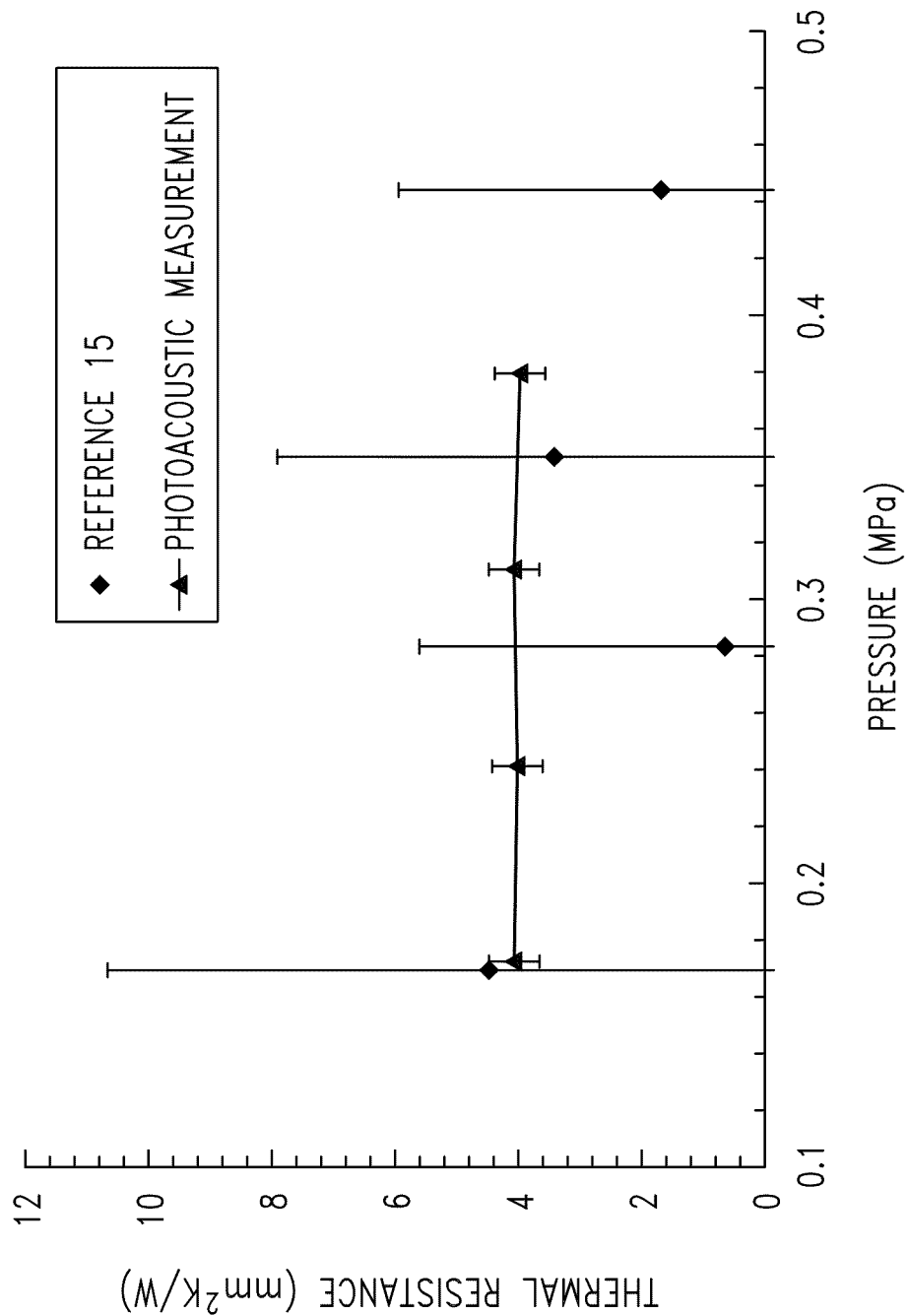
FIG. 10 shows thermal resistance as a function of pressure for a two-sided CNT interface ($R_{Si-CNT-CNT-Cu}$) measured with the PA method and the 1-D reference bar method according to one embodiment of the present invention.

One-sided CNT interface results are shown in Table 1, and two-sided CNT interface results are illustrated in FIG. 10 and displayed in detail in Table 2. The resistances at CNT-substrate interfaces (and CNT-CNT interface for the two-sided interface) and the intrinsic conductive resistance of the CNT arrays are grouped into the measured total interface resistances, $R_{Si-Ag}$ and $R_{Si-Cu}$. This lumping approach has no effect on the measured results because during each measurement the laser energy penetrates deep enough to pass through $R_{Si-Ag}$ and $R_{Si-Cu}$ and into the Si substrate.

TABLE 1

One-sided CNT interface results.

| Fitted parameters | Measured values at 241 kPa |
|---|---|
| $R_{Si-CNT}$ (mm² K/W) | 2.3 ± 0.4 |
| $R_{CNT-Ag}$ (mm² K/W) | 13.4 ± 0.2 |
| **$R_{Total}$ ($R_{Si-Ag}$) (mm² K/W) | 15.8 ± 0.2 |
| $a_{CNTS-on-Si}$ (M²/s) | 1.7 ± 0.3 × 10⁻⁴ |

TABLE 2

Two-sided CNT interface results.

| Fitted parameters | Measured values at 172 kPa | Measured values at 241 kPa |
|---|---|---|
| $R_{Si-CNT}$ (mm² K/W) | 0.8 ± 0.5 | 0.8 ± 0.5 |
| $R_{CNT-CNT}$ (mm² K/W) | 2.1 ± 0.4 | 2.1 ± 0.4 |
| $R_{CNT-Cu}$ (MM² K/w) | 1.0 ± 0.5 | 0.9 ± 0.5 |
| **$R_{Total}$ ($R_{Si-Ag}$) (mm² K/W) | 4.1 ± 0.4 | 4.0 ± 0.4 |
| $a_{CNTS-on-Si}$ (M²/s) | 3.2 ± 0.4 × 10⁻⁴ | 2.3 ± 0.4 × 10⁻⁴ |
| $a_{CNTS-on-Cu}$ (M²/s) | 2.1 ± 0.4 × 10⁻⁴ | 4.3 ± 0.5 × 10⁻⁴ |

**Obtained from data fit where CNT arrays are not considered as a layer in the PA model.

At a pressure of 0.241 MPa the one-sided CNT interface produces a thermal resistance of approximately 16 mm²·K/W. This photoacoustically measured resistance compares well with one-sided CNT interface results obtained using a steady state, 1-D reference bar measurement technique. The resistances at the CNT-substrate interfaces, $R_{Si-CNT}$ and $R_{CNT-Ag}$, are approximately 2 mm²·K/W and 13 mm²·K/W respectively, and it is clear that the CNT array free tips to substrate ($R_{CNT-Ag}$) interface dominates the thermal resistance of the one-sided CNT interface. A similar characteristic for one-sided CNT interfaces was reported in a previous study as well. A thermal diffusivity of approximately $1.7 \times 10^{-4}$ m²/s is measured for the CNT array on the Si wafer in the one-sided CNT interface sample.

At moderate pressures, 0.172-0.379 MPa, the two-sided CNT interface produces stable and low resistances near 4 mm²·K/W. For comparison, resistance values of a two-sided CNT interface measured with a reference bar method are also included in FIG. 10. FIG. 10 demonstrates that the PA results are similar to the reference bar results and fall well within the latter results' uncertainty range. The pressure dependent, two-sided CNT interface results validate a prior postulate that data scatter in the resistance-pressure characteristics of the reference bar measurements is due to the large uncertainty associated with the method. The resolved resistances of the two-sided CNT interface, $R_{Si-CNT}$, $R_{CNT-CNT}$, and $R_{CNT-Cu}$, are approximately 1 mm²·K/W, 2 mm²·K/W, and 1 mm²·K/W respectively, and the CNT-CNT interface dominates the thermal resistance of the interface. The CNT arrays in the two-sided interface have measured thermal diffusivities ranging from approximately $2.1-4.3 \times 10^{-4}$ m²/s.

With the thermal diffusivities measured in this study ranging from approximately $1.7-4.3 \times 10^{-4}$ m²/s and assuming the CNT arrays' room temperature effective specific heat to be approximately 600 J/kg·K, the effective thermal conductivities (including effects of void space) of the CNT arrays in this study are calculated to range from approximately 88-223 W/m·K. This estimated thermal conductivity range is higher than the thermal conductivity range, 74-83 W/m·K, reported for CNT arrays measured using the 3ω method. Yang et al. reported CNT array thermal conductivities averaging 15 W/m·K.

The thermal performance revealed by the PA measurement of the one-sided CNT interface can be attributed to the increase in real contact area enabled by the high density of CNT to surface contact spots. The thermal performance revealed by the PA measurements of the two-sided CNT interface can be attributed to an even larger increase in real contact area. The contact area between the two arrays is maximized during the initial loading procedure, so that further increases in pressure do not cause a significant increase in array-to-array CNT penetration. Compared to the resistances of a bare Si—Cu interface and a one-sided CNT interface (Si-CNT-Cu), which range from 105-196 mm²·K/W and 20-31 mm²·K/W respectively, a two-sided CNT interface produces much lower thermal contact resistance.

An interface with a CNT array directly synthesized on one side of the interface has been measured to have a resistance less than 25 mm²K/W, which is equal to the resistance of the state of the art commercial thermal interface materials. An interface created with a directly synthesized CNT array on one side of the interface and a wax-based phase change material (PCM) added to it has been measured to have resistances below 5 mm²K/W. An interface with a CNT array directly synthesized on both sides of the interface has been measured to have a resistance of 4 mm²KIW, which is similar to the resistance of a soldered joint. However, in applications where the materials that form the interface can not be exposed to the temperatures normally used for CNT growth, direct synthesis of CNT array interfaces is difficult to implement.

In addition, when interface surfaces are relatively rough (e.g. unpolished Cu—Cu interface as opposed to Si-glass interface) it can be difficult to directly synthesize CNT arrays dense and long enough to adequately fill the interface voids. Some embodiments of the present invention include a new CNT thermal interface material (TIM) with CNT arrays directly synthesized on both sides of a metal foil. The embodiment eliminates the need for exposing temperature sensitive materials and devices to normal CNT growth conditions (~900° C.) and provides greater conformability to rough interfaces due to the metal foils ability to match to the interface geometry.

Some embodiments of the present invention can be inserted into several different interface configurations; however, it differs from other TIMs in that it is dry, removable, and has an intrinsically high thermal conductivity. The thermal interface resistance of the embodiment (without PCM) is measured using a photoacoustic technique. A resistance of 7 mm²K/W was measured for a Cu-invention-Cu interface under moderate pressure.

Many parameters affect the performance of metal foils as thermal interface materials. Qualitatively, the thermal resistance of a metal foil interface depends on the thermal and physical properties of the contacting members, foil, and gas gap, the contact geometry, the contact pressure, and the interface temperature. While the foregoing functional dependencies are difficult to resolve analytically, empirical correlations have been developed that match experimental results reasonably well. Experimental observations have revealed the existence of a range of preferred thicknesses, for which thermal resistance is a minimum independent of contact pressure, for metal foils used in a given interface. Additionally, the parameter $k_{foil}/H_{foil}$ where $k_{foil}$ and $H_{foil}$ are the thermal conductivity and the hardness of the metal foil, respectively, has been suggested as a good measure to predict the performance of a metal foil in a given application. Higher $k_{foil}/H_{foil}$ ratios reduce thermal resistance at the interface.

For metal foils with CNT-enhanced surfaces, heat flow paths and resulting thermal models become substantially more complicated. In addition to the properties of the metal foil, the effective thermal and physical properties of CNT/foils depend on, among other factors, CNT density, CNT diameters in the array, and the bonding of the CNTs to the foil. Previous studies have shown not only that CNT arrays conform well in an interface but also that they have relatively high effective thermal conductivities (~80 W/m K) and can be bonded well to their growth substrate. These CNT array properties can be exploited, through optimization, to create a CNT/foil material whose effective thermal to effective hardness ratio $k_{CNT/foil}/H_{CNT/foil}$ is increased as compared to a bare metal foil. Both $k_{CNT/foil}$ and $H_{CNT/foil}$ are affected by the CNT array properties; however, reducing $H_{CNT/foil}$ is expected to be the primary means to increase $k_{CNT/foil}/H_{CNT/foil}$. Also, CNT/foil characteristics such as the thicknesses of the CNT arrays and the metal foil can be controlled such that the contact geometry allows interfacial void spaces to be filled completely, thus overcoming the resistance to heat flow caused by the roughness of a given interface.

Figure 16:
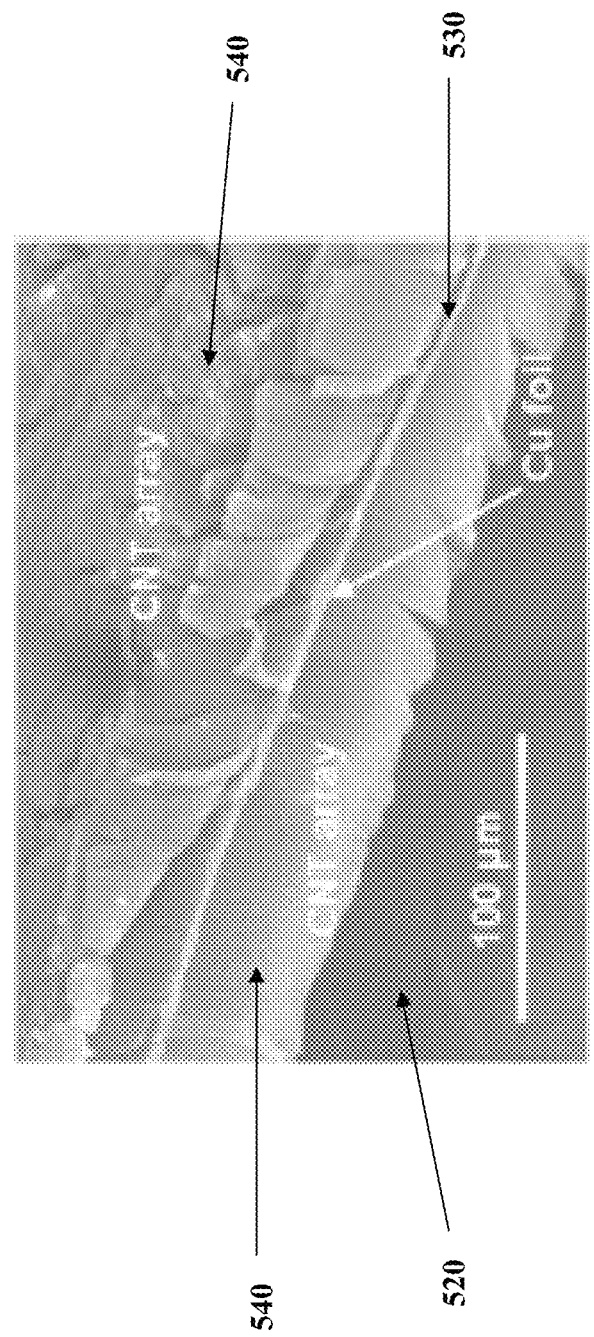
FIG. 16 shows CNT arrays synthesized on both sides of a 10 µm thick CU foil according to another embodiment of the present invention. The density is ~$10^8$ CNTs/mm². Both CNT arrays are approximately 50 µm in height and the average CNT diameter is approximately 20 nm.
Figure 17:
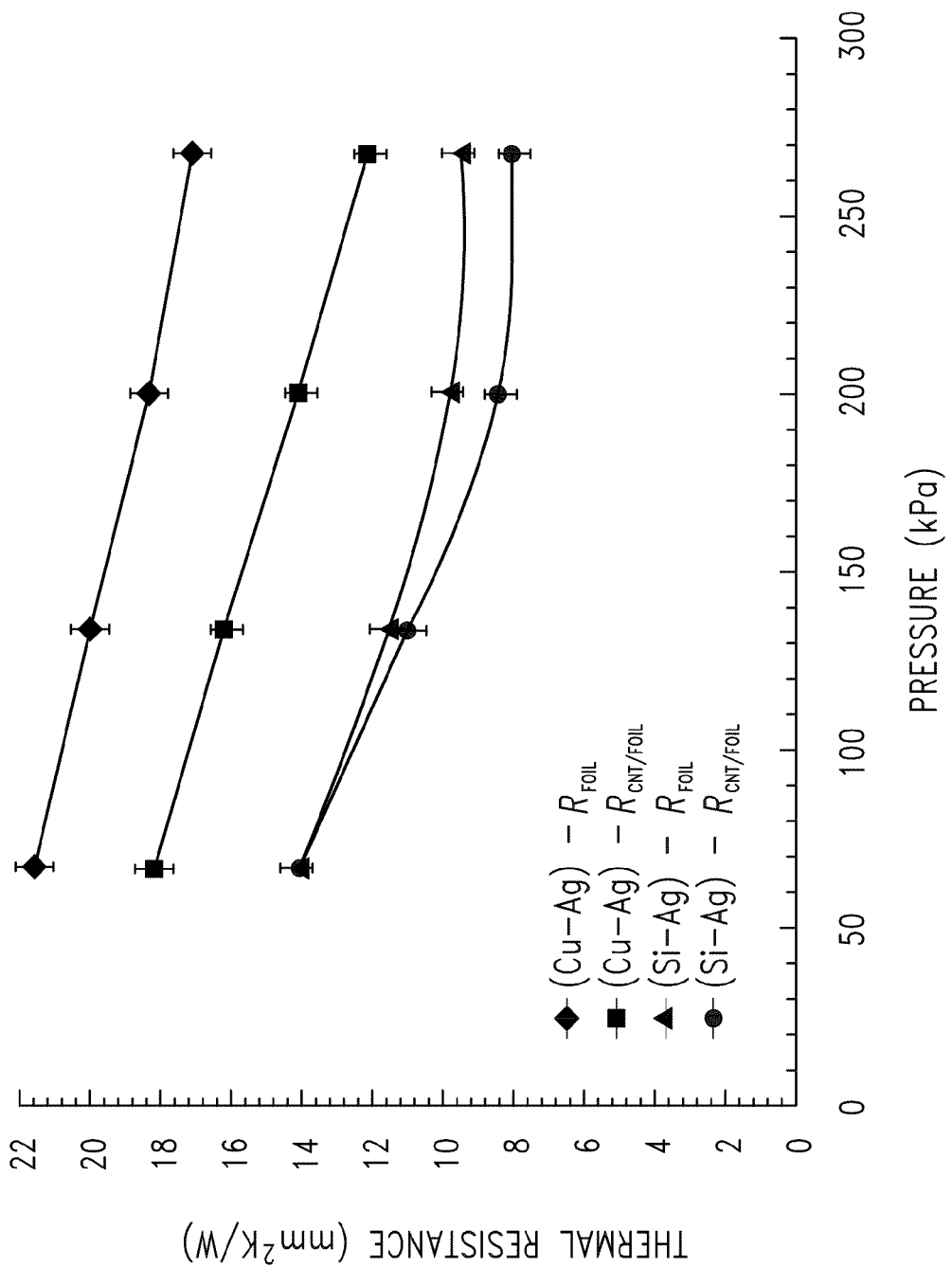
FIG. 17 Thermal resistances of bare foil interfaces, $R_{foil}$ and CNT/foil interfaces, $R_{CNT/foil}$, as a function of contact pressure.

Plasma-enhanced chemical vapor deposition (PECVD) was used to synthesize the CNT arrays 540 according to some embodiments of the present invention. Referring to FIGS. 16 and 17, a trilayer catalyst configuration 550, 552, 554 (30 nm Ti/10 nm Al/3 nm Fe, respectively) was deposited on both sides of 10 μm thick Cu foil substrate 530, according to another embodiment of the present invention. The PECVD process gases were $H_2$ [50 SCCM (SCCM denotes cubic centimeter per minute at STP)] and $CH_4$ (10 SCCM), and the growth pressure and temperature were 10 Torr and 900° C., respectively. A 200 W plasma was formed in the growth chamber, and CNT synthesis was carried out for 10 min. FIG. 16 contains a scanning electron microscope (SEM) image that shows a side view of the two CNT arrays synthesized on the Cu foil. As determined from microscopy (SEM and transition electron microscope) and Raman spectroscopy, the structural characteristics (e.g., prevalence of CNT defects and amorphous C) of the CNT arrays are similar to CNT arrays grown on Si in previous work. Each array 540 is fairly uniform in height (approximately 50 μm) and the average CNT diameter is approximately 20 nm. The density of each array is preferably greater than greater than ~$10^7$ CNT/mm$^2$ and preferably is ~$10^8$ CNTs/mm$^2$.

The room-temperature thermal interface resistance of a CNT/foil TIM and bare 10 μm thick Cu foil was measured as a function of pressure using a photoacoustic (PA) technique. The pressure range was chosen to identify the effects of CNT enhancement in a range applicable to the thermal management of electronic components. Two different interfaces, in which the CNT/foil and bare foil were inserted, were assembled to identify the effects of surface roughness on the performance of the CNT/foil TIM. To enable the PA measurements, both interfaces use Ag for the top substrate in the interface. The Ag is relatively smooth, having an average surface roughness $R_a$ of 0.06 μm and an average peak-to-valley surface height $R_z$ of 0.4 μm. A polished Si base, having $R_a$=0.OI μm and $R_z$=0.09 μm, was used as the opposing substrate in the first interface (Si—Ag). A Cu base, having $R_a$=2.8 μm and $R_z$=9.3 μm, was used as the opposing substrate in the second interface (Cu—Ag). The total thermal resistances of the CNT/foil, $R_{CNT/foil}$, and of the bare foil, $R_{foil}$, for the two different interface configurations are presented in FIG. 17.

For both configurations, the CNT/foil was examined before and after testing to assess any permanent physical changes to the material. For the Si—Ag interface, the assembly 520 of CNT/foil had an appearance that closely resembled the pretest condition upon removal. For the rough Cu—Ag interface, deformation of the CNT/foil assembly 520 was apparent such that its shape matched the interface geometry. In each case, upon separation of the interface, the CNT arrays 540 remained fully intact on the surfaces of the foil. To illustrate its robustness, after removal, the CNT/foil was retested in each interface, and the measured thermal resistances were consistent with the initial tests.

The bare Cu foil and the CNT/foil TIMs produce low thermal resistances in both interface configurations. This result is expected because of the relatively smooth contacting member surfaces. The plots of FIG. 17 illustrate that the CNT arrays provide greater enhancement to the thermal conductance of the Cu foil in the rougher Cu—Ag interface. A reduction in resistance of approximately 30% is achieved at a contact pressure of 275 kPa. For the smooth Si—Ag interface, enhancement results when sufficient contact pressure is applied, and an approximately 15% reduction in resistance is achieved at a contact pressure of 275 kPa. Various embodiments of the present invention contemplate the use of contact pressures greater than about 50 kPa.

The CNT/foil assembly 520 increases conduction in the interface by two mechanisms, both of which cause an increase in the number density of contact points between free CNT tips and their opposing substrate. The first mechanism is the deformation of the CNT arrays 540 and the second is the deformation of the foil substrate 530. It is possible that the CNT array deformation is elastic (i.e., there was no evidence of tube buckling), although van der Waals interactions among the tubes can cause them to bundle together after experiencing interfacial compression (mimicking the geometry of the surface asperities), and that the Cu foil deformation is both elastic and plastic as in the case of bare foil. For each interface configuration, the CNT arrays and foil deform concurrently with increased pressure. For the Si—Ag interface, the CNT/foil deforms with increased pressure until a condition exists at which it no longer deforms, and its improved thermal performance over that of the bare foil becomes constant. Even for this smooth interface, the slight deformation of the foil around the surface asperities (primarily on the Ag surface) is apparently sufficient to increase the number density of contact points between free CNT tips and their opposing substrate.

For the relatively rough Cu—Ag interface, the effect of the Cu foil's deformation is more significant due to the larger surface asperities that may prevent CNTs from initially bridging the interface gap. For this interface, the CNT/foil 520 exhibits better thermal performance than the bare foil because its foil component deforms under high local stress to match the asperities of the interface while the CNTs presumably deform along with it to create substantially more contact points. For this interface, a maximum deformation extent did not occur in the tested pressure range, and it is expected that under higher pressures, the CNT/foil would continue to conform to the interface, further improving its performance as compared to that of the bare foil.

Figure 18:
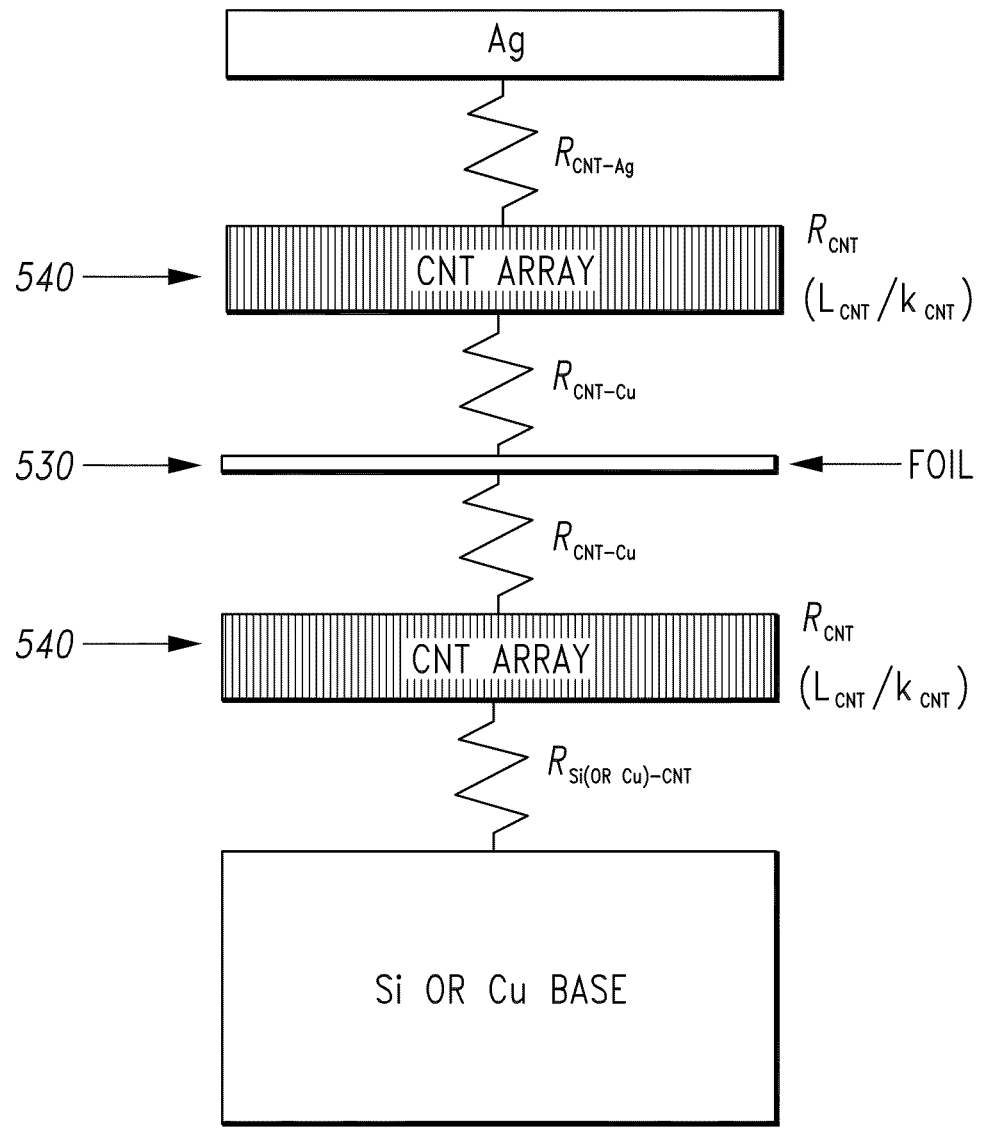
FIG. 18 Thermal circuit for the CNT/foil interface. The local resistances sum to give $R_{CNT/foil}$.

The two deformation mechanisms of the CNT/foil aid in increasing the number density of contact points between free CNT tips and their opposing substrate. To better illustrate the enhancements that occur at both of the free CNT tip interfaces, the PA method has been used to measure local component resistances within the interface structure. A resistive network for the CNT/foil interface is illustrated in FIG. 18. The interface resistance between a CNT array and its Cu growth substrate ($R_{CNT-Cu}$), approximately 1 mm$^2$ K/W, and the effective thermal conductivity of CNT arrays synthesized under conditions similar to the ones of this study, approximately 80 W/m K (which corresponds to an intrinsic resistance $R_{CNT}$ of approximately 1 mm$^2$ K/W for each CNT array in this study), have been measured in previous work. For the CNT/foil material, the combined resistance of both CNT arrays, both CNT-foil interfaces, and the Cu foil (<0.3 mm$^2$ K/W) sums to approximately 4 mm$^2$ K/W. The remaining resistance in the CNT/foil interface is therefore produced by the resistance between the CNT arrays' free tips and the two contacting members ($R_{Si-CNT}+R_{CNT-Ag}$ for the Si—Ag interface and $R_{Cu-CNT}+R_{CNT-Ag}$ for the Cu—Ag interface).

Figure 19:
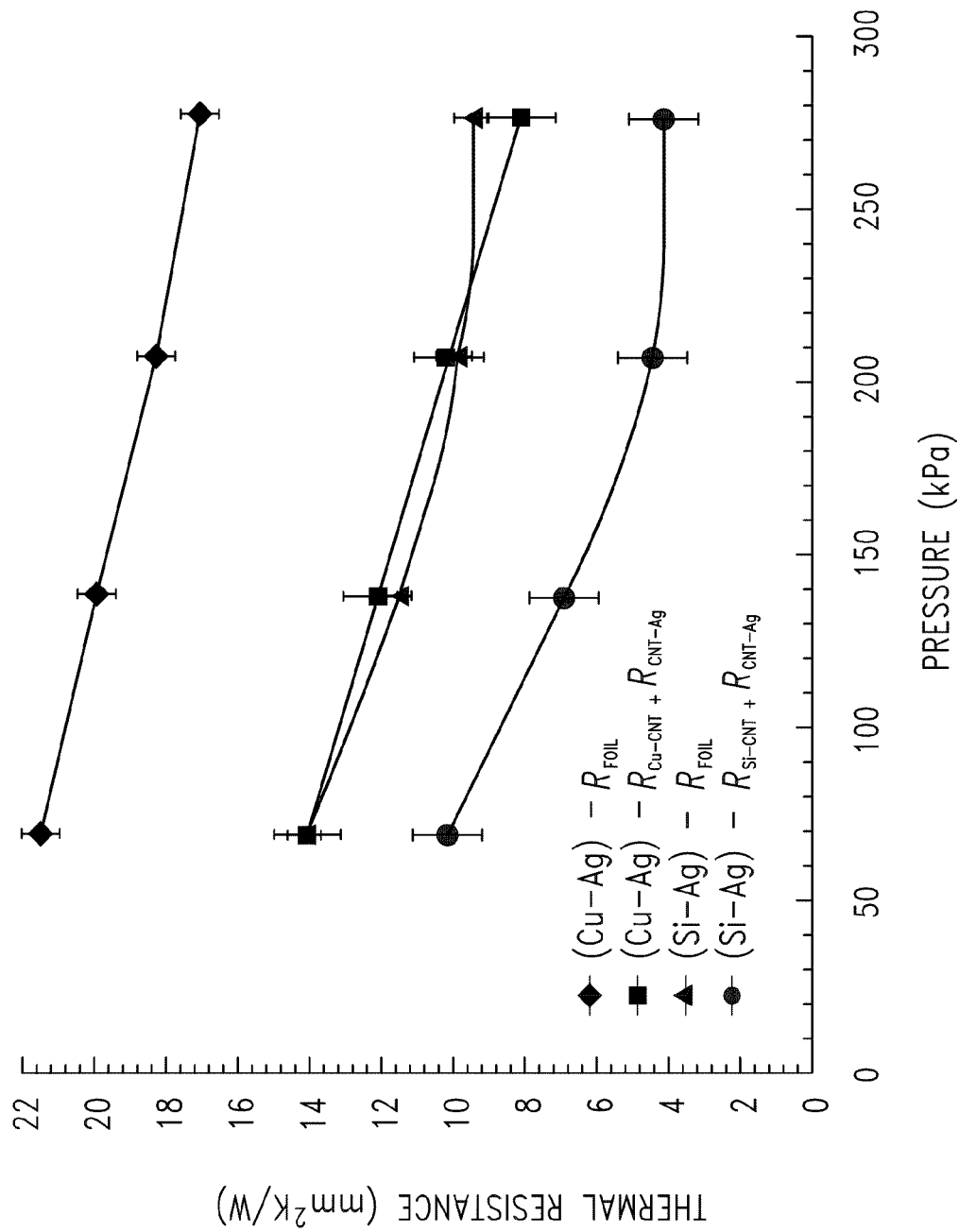
FIG. 19 Thermal resistance between the two free surfaces of the samples. For the bare foil, the resistance is the same as $R_{foil}$. For the CNT/Foil the resistance is the sum of the two free CNT tip interface resistances.

The resistances at the free surfaces of the bare foil (same as $R_{foil}$) and the free surfaces (i.e., free CNT tips) of the CNT/foil are illustrated in FIG. 19 for both interface configurations. Clearly, the thermal resistance at the contacting member interfaces is greatly reduced by the presence of the CNT arrays. A reduction in resistance greater than 50% is observed for both interface configurations at moderate pressure. These results suggest that the CNT/foil configuration is highly effective in increasing the number density of contact points between free CNT tips and their opposing substrate and thus provides an effective means of increasing the real contact area in a thermal interface In yet another embodiment of the present invention, and referring to FIGS. 20 and 21, plasma-enhanced chemical vapor deposition (PECVD) was used to synthesize the CNT arrays 640. A tri-layer catalyst configuration 650,652,654 (30 nm-Ti/10 nm-A½ nm-Fe, respectively) was deposited on both sides of 2 µm-thick aluminum foil 630. The active Fe catalyst layer 654 was about 2 nm to facilitate the growth of small diameter multiwalled CNTs. Due to the relatively low melting temperature of aluminum (~660° C.) and to allow the process gases to reach both of its surfaces, the foil assembly 620 was elevated by ceramic spacers, 1.2 mm in height, on a growth stage set at 650° C.

Figure 20:
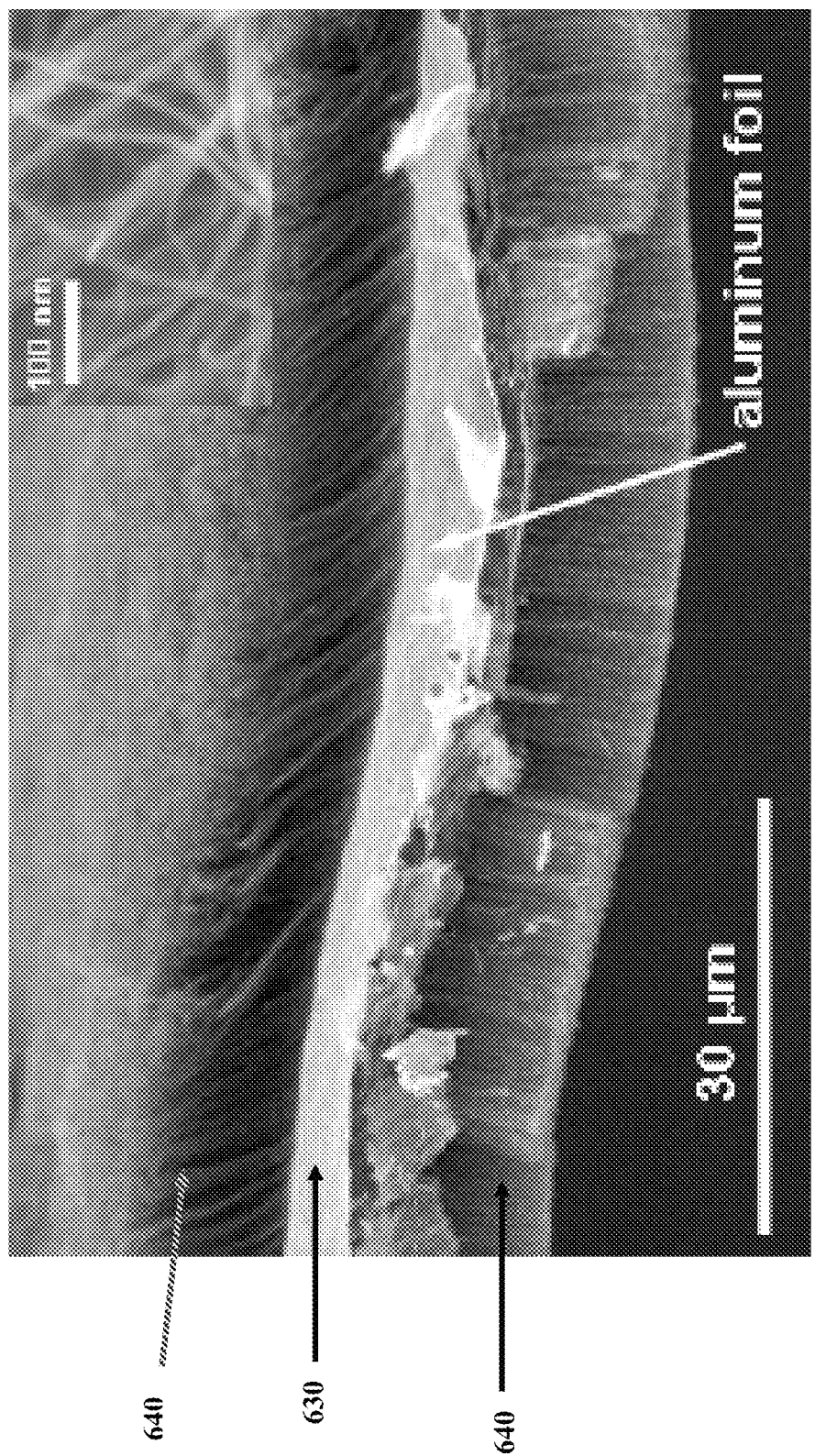
FIG. 20 CNT arrays synthesized on both sides of aluminum foil according to another embodiment of the present invention. The insert is a higher magnification SEM image that illustrates the CNT diameters in the array.

The PECVD process gases were H$_2$ (40 sccm) and CH$_4$ (10 sccm), to promote dense low-temperature growth, and the pressure was 10 Torr. A 100 W plasma was formed in the growth chamber and concentrated on a molybdenum shield placed above the aluminum foil, and synthesis was carried out for 10 min. Shielding was used during growth to prevent excess heating and foil damage (hardening) due to direct plasma exposure. The temperature on the top of the molybdenum shield was measured with a pyrometer to be 655° C. When the plasma shield was not used and/or when the growth temperature was higher, visible foil damage was noticed and the aluminum foil/CNT material became stiff and brittle (most likely due to exacerbated hydrogen embrittlement of the aluminum). A scanning electron microscope (SEM) is used to image the CNT arrays on the aluminum foil as illustrated in FIG. 20. Each array is approximately 10 µm tall, and the average CNT diameter is approximately 10 nm. The CNT density of each array is ~10$^9$ CNTs/mm$^2$.

Figure 21:
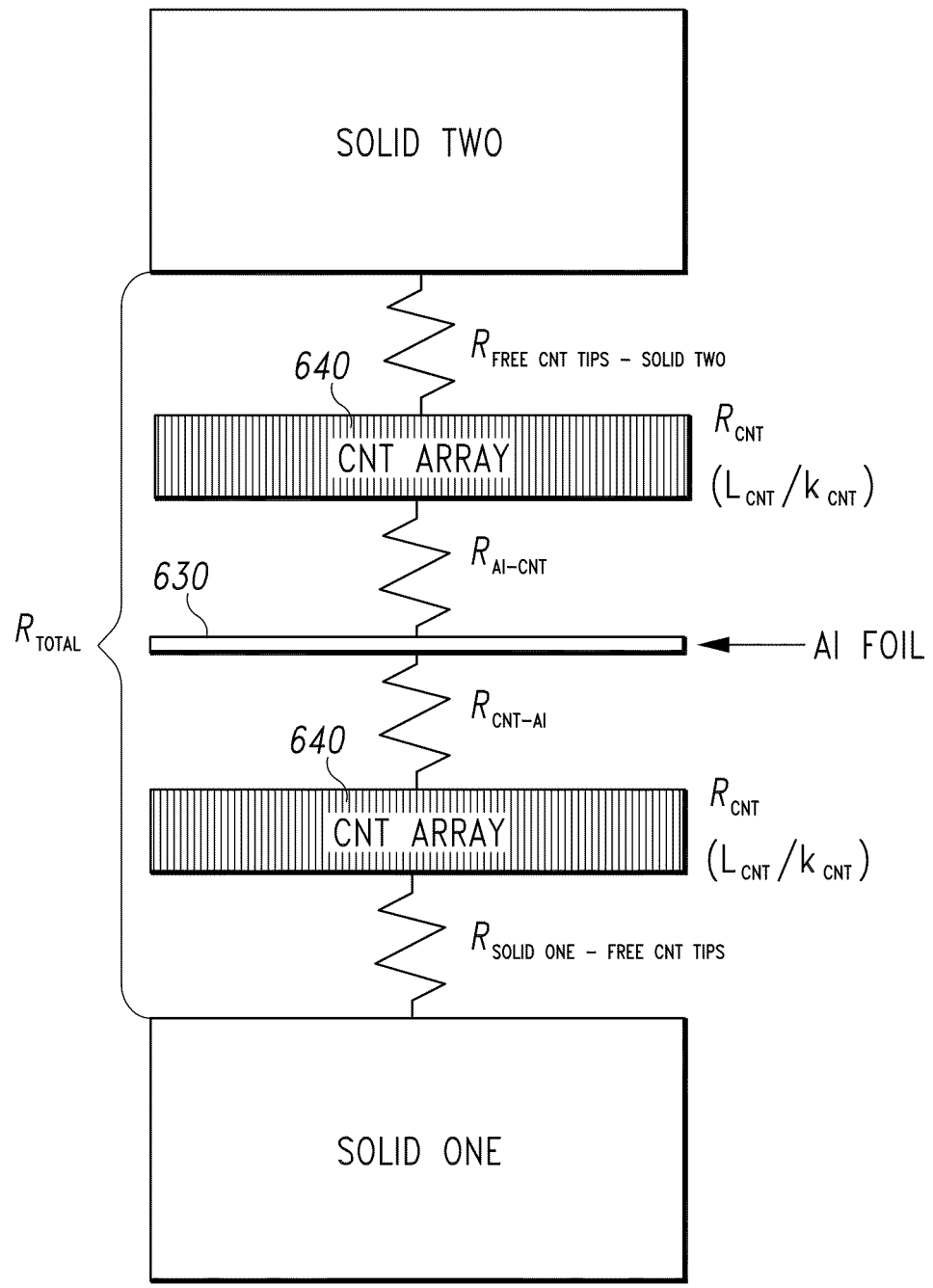
FIG. 21 Resistive network for the aluminum foil/CNT interface.

A resistive network for the aluminum foil/CNT assembly 620 interface is illustrated in FIG. 21. The room-temperature thermal resistance of the complete interface, $R_{total}$, was measured for smooth and flat mating solids (silver foil and polished silicon) using a photoacoustic (PA) technique. The PA technique involves periodically heating the sample surface, which is surrounded by a sealed acoustic chamber. The temperature-induced pressure response in the acoustic chamber is measured and used to determine thermal properties. The transient nature of the PA technique allows for precise measurement of the thermal resistance of the aluminum foil/CNT interface (error ~1 mm$^2$ K/W), and a resistance value of approximately 10 mm$^2$ K/W was achieved at an interface pressure of 345 kPa.

The aluminum foil/CNT assembly 620 was also tested in a less ideal interface (i.e., rougher, wavier, and less flat) and over a larger area (1×1 cm) using a one-dimensional reference bar technique, and a resistance value of approximately 90 mm$^2$ K/W was measured at 345 kPa. It may be possible to attribute the relatively poor performance in the less ideal, rougher interface to three characteristics of the aluminum foil/CNT material fabricated in this study that may have prevented a significant increase in real contact area; small CNT array heights, a large density of small diameter CNTs in the arrays, and possible stiffening of the aluminum foil during CNT growth. The small heights may hamper the ability of the CNT arrays to fill the interfacial voids, especially in highly rough and/or warped areas of contact. For closely packed, small diameter CNTs, tube-to-tube van der Waals interactions are strong such the CNTs aid each other in reaming ridged, which causes the CNT array to be relatively stiff and to perform like a macro material. Stiffening of the aluminum foil during CNT growth could further impede the aluminum foil/CNT materials ability to conform in the interface. These effects are less significant in the smooth interface because only modest (in comparison) aluminum foil/CNT material deformation is necessary to enhance real contact area. After both tests, the interfaces were separated, and the CNT arrays remained firmly attached to the aluminum foil, indicating the good adhesion provided by the reported growth technique.

Figure 11:
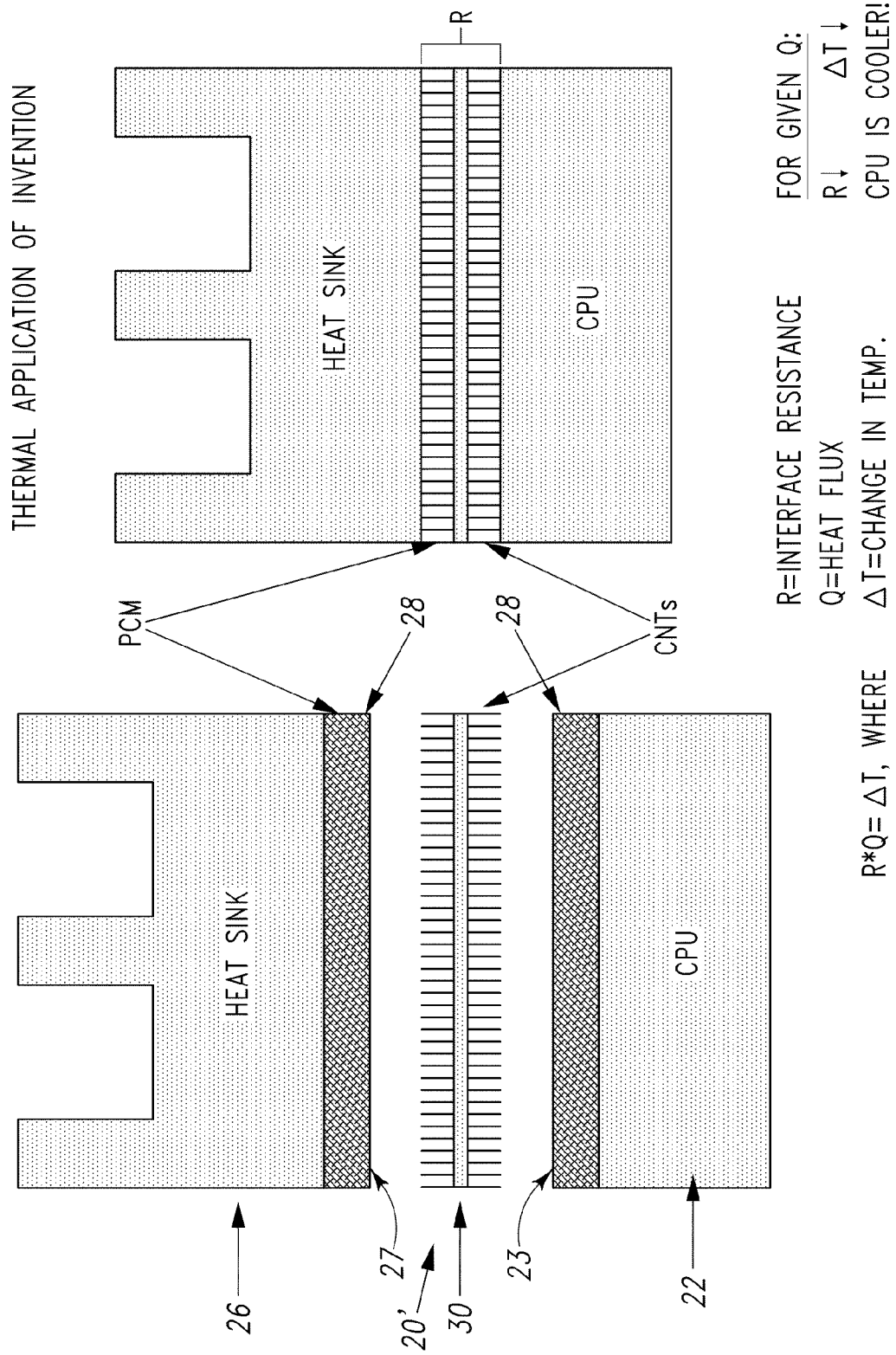
FIG. 11 is a schematic representation of an apparatus according to one embodiment of the present invention.

FIG. 11 shows one embodiment of the invention in application (not to scale) with a phase change material (PCM). A thin layer of wax based PCM is applied to the surfaces of the two devices that are at the interface. Then, the apparatus is inserted in between the two wax covered surfaces and a pressure is applied. The wax is heated until it changes from a solid phase to a liquid phase. In the liquid phase the PCM wets the CNT array, filling the voids in the array and interface completely. The CNTs, now embedded in the PCM, act as a highly conductive thermal path in the newly formed composite interface material. The wetting of the PCM to the CNTs also discourages the PCM from running out of the interface in its liquid phase.

FIG. 11 shows a nanoparticles assembly 20 located between a heat source 22 (such as a CPU) and a heat sink 26 (such as a finned array). Preferably, both surface 23 of CPU 22 and surface 27 of heat sink 26 include a layer of a phase change material 28. However, in other embodiments the use of a PCM can be limited to only one of the surfaces.

Nanoparticle assembly 20 includes a thin, substantially flat substrate 30 that plastically deforms under light pressure, such as the aluminum, copper, and silver foils previously discussed herein. Further, although certain materials have been shown and described, the present invention contemplates the use of other materials having roughly similar conductivity, electrical conductivity, and ductility.

Substrate 30 includes the opposing planar surfaces 32 and 34. In one embodiment, each opposing surface has deposited thereon an array of nanoparticles, including nanofibers, nanorods, nanowires, nanotubes, or buckyballs. In some embodiments, the nanoparticles are multiwalled carbon nanotubes (MWCNTs). Further, in some embodiments, the nanoparticles are deposited on a single surface of substrate 30. In yet other embodiments the MWCNTs are aligned by an electromagnetic field to be substantially perpendicular to the surface of the substrate.

FIG. 11 shows the assembly of the heat sink to the CPU. The nanoparticles 40 combine with a heat sensitive material 28 such as a phase change material (PCM) to form a composite material 28' which has increased resistance to flow as compared to phase change material 28.

Figure 12:
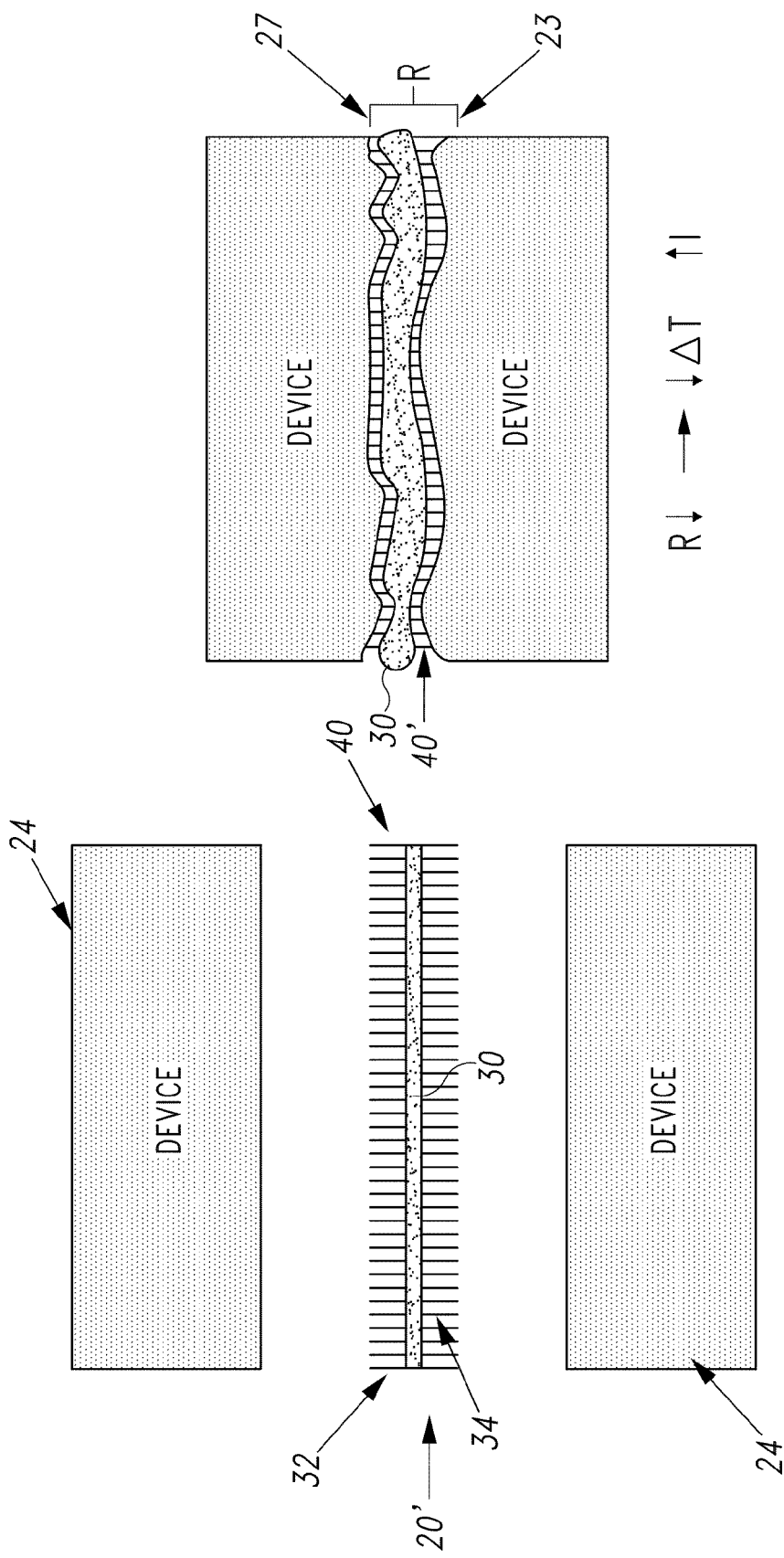
FIG. 12 is a schematic representation of an apparatus according to another embodiment of the present invention.

FIG. 12 shows one embodiment of the present invention in an application (not to scale). The conformable metal foil is preferably covered with dense CNT arrays on both of its surfaces. When placed in the interface, under a moderate applied pressure, the embodiment conforms to the interface due to the ductile nature of the substrate or foil. This conformability allows the CNTs to better span the interface gap and penetrate into the surface cavities, in effect increasing the real contact area in the interface. This increase in contact area leads to a reduction in resistance to heat flow (Q) or electrical current (I) flow through the interface. The reduction in resistance to heat flow allows a device to operate at lower temperatures and the reduction in resistance to current flow allows a device to pass current more efficiently. The present embodiment also contemplates the use of metallic foil or metallic or nonmetallic deformable membranes with CNT arrays on only a single surface.

The metal foil used in the embodiment can be any conductive (thermal and/or electrical) foil (e.g. copper, aluminum, etc.) that is thin and ductile enough to mechanically conform to the roughness of an interface created by mating devices. The CNT arrays can be synthesized on one or both the foil surfaces using any CNT synthesis technique that allows for dense, vertically oriented CNT arrays to be directly grown on both sides of metal substrates while having strong mechanical adhesion between the CNTs and the surfaces (as one example, plasma-enhance chemical vapor deposition (PECVD) and a Ti underlayer on the substrates surfaces to promote adhesion). The present invention also contemplates those embodiments in which the CNT arrays are attached to thin, readily deformable members that are not metallic.

FIG. 12 shows two devices 24 with a nanoparticle assembly 20 inbetween. Each device 24 can be a heat source, a heat sink, a heat spreader, or any other type of device in which it is desired to improve the thermal interface. The respective thermal interfaces 23 and 27 include various surface irregularities, including out of flatness conditions, roughness pitting, machining marks, and other microscopic irregularities. These irregularities are shown in increased amplitude to the right side of FIG. 12.

Nanoparticle assembly 20 is placed between the devices 24, and light pressure is applied to cause substrate 30 to conform to at least some of the surface irregularities. Further, the nanoparticle arrays 40 fill in various pits and voids.

FIG. 13 shows apparatus and method for joining two structures according to one embodiment of the present invention. In another embodiment of the present invention two members 60 and 62 joined with a nanoparticle assembly 120. As shown in FIG. 13, two polymer members 60 and 62 are to be joined at a structural interface, such that these two members 60 and 62 can transfer mechanical load through the interface. Although flat, planar structural interfaces are shown, it is understood that the present invention contemplates the joining of members in which the structural interfaces are complementary in shape, including but not limited to tongue in groove joints, dovetail joints, lap joints, miter joints, and mortise and tenon joints.

A nanoparticle assembly 120 is placed within the structural interface. Assembly 120 is substantially the same as assembly 20, except that the nanoparticle type, nanoparticle material, and substrate material may be altered for improved compatibility in this application. As one example, in some embodiments the substrate material 130 includes a heat sensitive material such as a thermosetting adhesive.

The assembly of members 60, 62 and 120 are placed in contact. Nanoparticle assembly 120 closely follows both the macro and micro shape of the structural interfaces, including filling in various voids, pits, and irregularities. In some embodiments, pressure can be applied to maintain the assembly in contact. The structural interface is then exposed to appropriate electromagnetic radiation which the nanoparticles convert into heat. The hot nanoparticles in turn heat into the adhesive and also the structural interfaces. For those embodiments where substrate 130 is a thermosetting adhesive, the heat is sufficient to increase the temperature of the adhesive to its activation point. In yet other applications, the temperature is sufficient to fuse the structural interfaces together by melting or diffusional processes.

Figure 14:
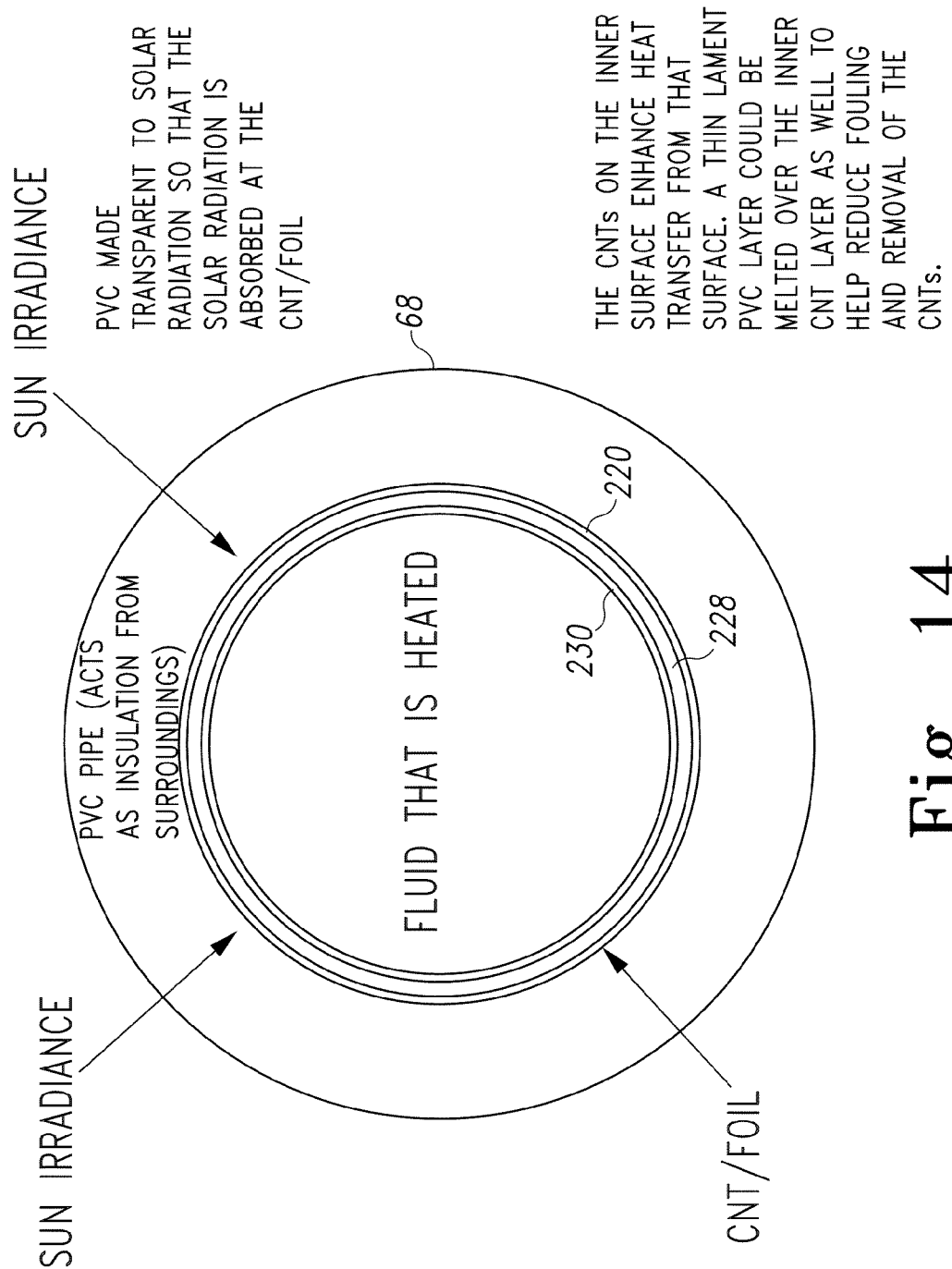
FIG. 14 is a schematic representation of an apparatus and method according to another embodiment of the present invention.

FIG. 14 is a cross sectional view of a fluid conduit 68 according to another embodiment of the present invention. Conduit 68 includes on its inner cylindrical surface a layer 220 of a nanoparticle assembly. In some embodiments nanoparticle assembly 220 further includes a matrix layer 228 which bonds adjacent nanoparticles 240 together. Preferably, assembly 220 includes nanoparticles 240 on a single side of substrate 230, such that the opposite side of substrate 230 (the side without nanoparticles) is in contact with fluid being transported within conduit 68. The nanoparticle array 240 provides a highly conductive and efficient thermal path from the walls of the conduit 68 to the fluid within the lumen of the conduit. As one example, this additional layer could be a PVC matrix material 68 which helps prevent any fouling from the fluid flow within the conduit to the nanoparticles, and further prevents inadvertent removal of the nanoparticles by erosion from the fluid flow.

Figure 15:
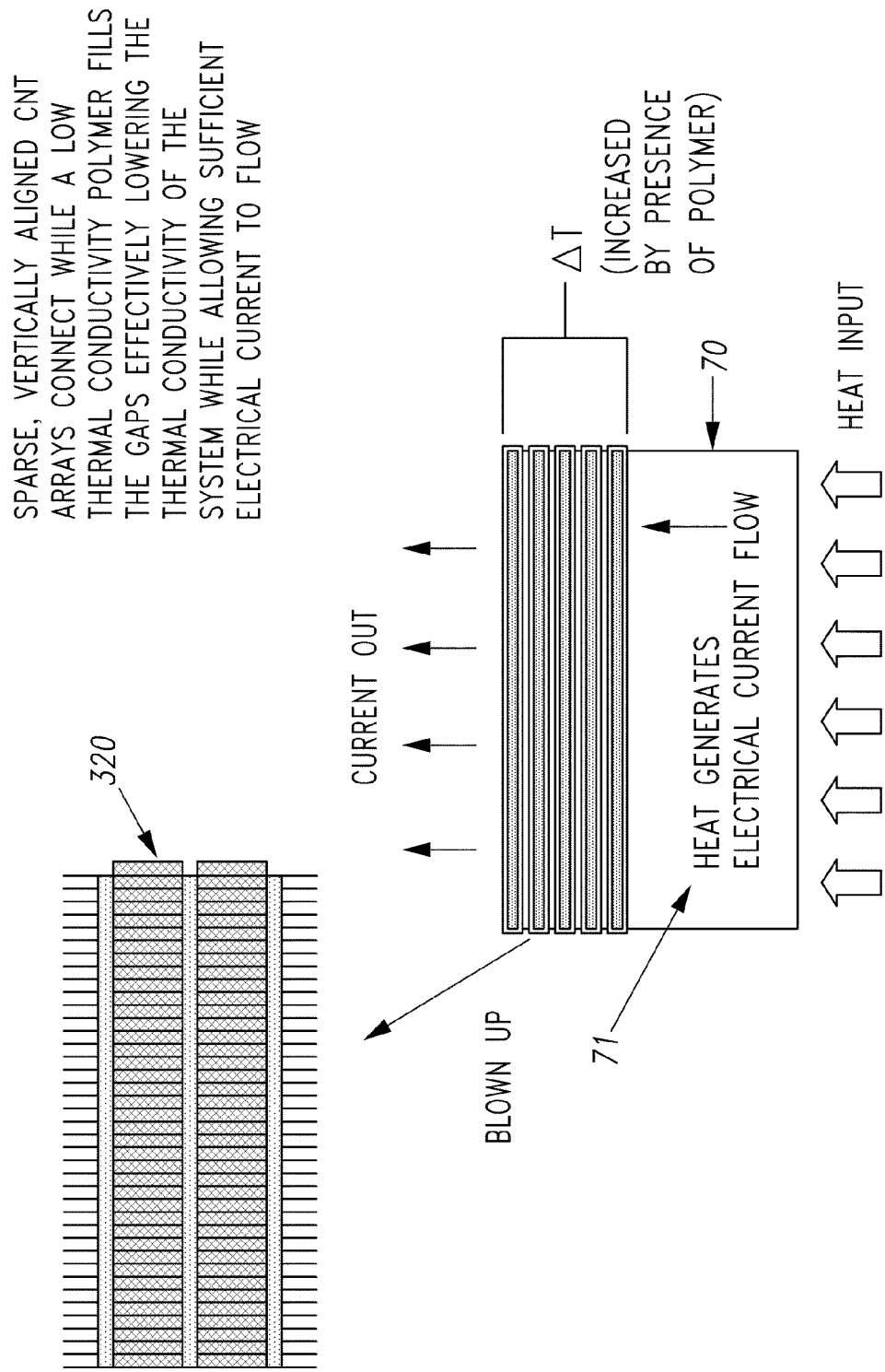
FIG. 15 is a schematic representation of an apparatus and method according to another embodiment of the present invention.

FIG. 15 shows another embodiment of the present invention as apparatus and method for thermally insulating an object while providing low electrical resistance. In one embodiment, a plurality of nanoparticle assemblies 320 is placed as an interfacing layer between an energy converting device 70 and a current path 71. In one embodiment the nanoparticle arrays are embedded within a low thermal conductivity polymer 328, which lowers the overall thermal conductivity of the system, while still permitting the nanoparticles to conduct electrical current with relatively low resistive losses.

Figure 22:
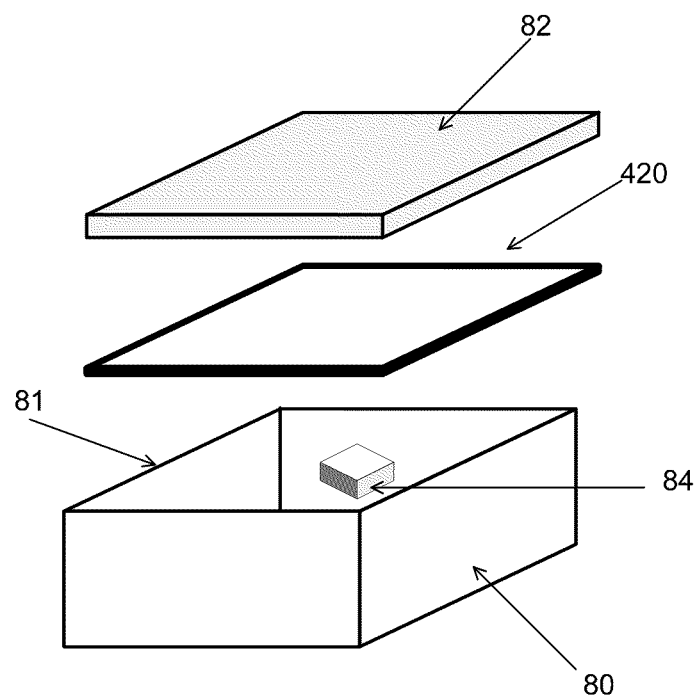
FIG. 22 is an exploded schematic representation of an apparatus according to another embodiment of the present invention.

FIG. 22 is an exploded view of an electronics assembly according to one embodiment of the present invention. There is an electrical housing 80 which includes one or more electronic components 84. Components 86 include any kind of electrical device which generates electrical noise, or is susceptible to electrical noise, including CPUs, memory chips, sensors, communication chips, and the like. Housing 80 includes an opening 81 through which the various components 86 are assembled into housing 80. A lid 82 is releasably attached to cover the opening of housing 80 by one or more fasteners (not shown).

A flexible and deformable nanoparticle assembly 420 is adapted to have the shape of the interface between the opening 81 and the lid 82. Preferably, nanoparticle assembly 420 is held tightly between lid 82 and housing 81 when the fasteners (not shown) are tightened. In one embodiment, nanoparticle assembly 420 includes a flexible metallic foil substrate that is populated on at least one side by a plurality of electrically conductive nanoparticles. Preferably, the nanoparticle array 240 comprises multiwalled carbon nanotubes grown from one side of substrate 430 and aligned substantially perpendicularly to the attachment surface. Nanoparticle assembly 420 uses the multiplicity of highly electrically conductive MWCNTs to establish a barrier to electromagnetic interference (EMI), and thus act as an EMI gasket.

Figure 23:
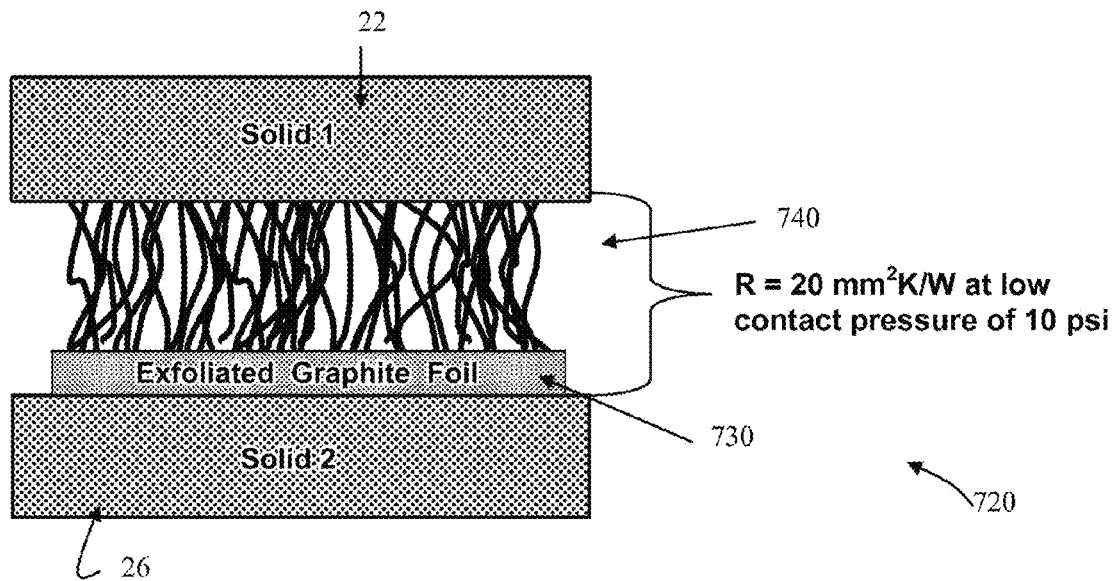
FIG. 23 shows thin flexible substrates made from compressed graphite flakes or woven CNTs, which can enhance thermal performance by adding additional compliance to the interface, and by establishing gradient morphology between the carbon atoms of the CNTs and the substrate material, which can reduce thermal resistance.

Yet other embodiments of the present invention are depicted in and discussed with regards to FIGS. 23-28. FIG. 23 shows CNT arrays 740 that are directly synthesized on one or both sides of a carbon-based substrate 730 such as woven CNTs or compressed exfoliated graphite to form a material that is dry, highly conductive, and conformal to an interface. The carbon foils 730 can be processed thin to achieve a compliant CNT-foil material. By synthesizing the CNT arrays on the carbon-based foil and subsequently adding the assembly of CNTs and foil to an existing device, the enhancement of CNT arrays can be added to the existing interface without the need to synthesize directly CNTs on the existing devices (which device can be destroyed by the temperatures used for CNT growth, and which process limits scalability). Nanoassembly 720 is preferably fabricated separately from the device (such as heat source 22, heat sink 26, device 70, housing 80, and the like), removed from the processing chamber, and separately placed on the device to which heat is to be conducted. FIG. 23 shows a conductive nanoassembly 720 with the substrate 730 being in thermal contact with heat sink 26, and the carbon nanotubes 740 being in thermal contact with the heat source 22.

The insertion of the CNT-carbon foil assembly between a processor chip or an integrated circuit (IC) device and a heat sink allows the chips or IC devices to operate at lower temperatures. The insertion of the CNT-carbon foil assembly between an electrical device and a connecting electrical device allows electricity to pass between the devices with minimal resistance.

Carbon-based substrates such as woven CNT films or compressed graphite flakes can be processed to thin sizes (~10 nm) while maintaining good structural integrity, especially in comparison to metal foils. Such thin films add additional compliance and allows them to achieve increased contact area and conductance in an interface application. Various embodiments of the prevent invention include the use of carbon-based substrates up to thicknesses of at least one hundred microns. Furthermore, the gradient morphology established at the CNT-carbon substrate interface can promote more efficient heat transfer. Some embodiments of the present invention include the formation of carbon-carbon bonds when the CNTs are grown on carbon substrates. These bonds can improve adhesion between the CNT and the substrate as well as improve thermal transport between the CNT and the substrate.

An interface with a CNT array directly synthesized on one side of the interface has been measured to have a resistance less than 8 mm$^2$K/W, which is better the resistance of the state of the art commercial thermal interface materials. An interface with a CNT array directly synthesized on both sides of the interface has been measured to have a resistance of 4 mm$^2$K/W, which is similar to the resistance of a soldered joint. However, in applications where the materials that form the interface can not be exposed to the temperatures normally used for CNT growth, direct synthesis of CNT array interfaces is difficult to implement. In addition, when interface surfaces are relatively rough (e.g. unpolished Cu—Cu interface as opposed to Si-glass interface) it can be difficult to directly synthesize CNT arrays dense and long enough to adequately fill the interface voids.

Various embodiments of the present invention contemplate the use of carbon nanotube arrays (both single-walled and multiwalled) directly synthesized on one or both sides of a thin, carbon-based substrate sometimes referred to as a "foil." Examples of these carbon-based substrates include CNT buckypaper, woven CNT sheets, CNT sheets held together by van der Waals forces, graphite sheets, Nanocomp Technologies Inc. CNT sheets, compressed graphene sheets, graphene sheets held together by van der Waals forces, sheets made from compressed exfoliated graphite, and sheets made from any carbon nanoparticle assembly held together by van der Walls forces or by mechanical entanglement.

Various embodiments of the present invention differs from some existing TIMs in that it is dry, removable, and has an intrinsically high thermal conductivity. The thermal interface resistance according to one embodiment of the present invention was measured using a photoacoustic technique. A resistance of 20 mm$^2$K/W was measured at 10 psi of pressure for a structure that consisted of a CNT array grown on one side of 100 micron-thick compressed exfoliated graphite foil. The use of thinner graphite foils and thin (~10 nm) woven CNT foils provides improved performance because of the increased compliance of thinner structures. Also, growing CNTs on both sides of the foil (thermal interface assemblies 720' and 820' shown in FIG. 25 and thermal interface assembly 920' shown in FIG. 26) further reduces resistance as was demonstrated for metallic foil samples with CNT arrays grown on both sides.

In one embodiment, an e-beam evaporator was used to deposit a tri-layer catalyst configuration including 30 nm Ti, 10 nm Al, and 2 nm Fe. Arrays of CNTs were then synthesized in a SEKI AX5200S microwave plasma chemical vapor deposition (MPCVD) system. The growth chamber was evacuated to 1 Torr and purged with $N_2$ for 5 min. The samples were heated in $N_2$ (30 sccm) to a growth temperature of 900° C. Then the $N_2$ valve was closed and 50 sccm of $H_2$ was introduced to maintain a pressure of 10 Torr in the growth chamber. After 1 min, a 200 W plasma was ignited and 10 sccm of $CH_4$ was introduced to commence 10 min of CNT synthesis.

The array densities were about $10^8$-$10^9$ CNTs/mm$^2$ (the single-sided foil/CNT samples had the lowest densities which were nearer to $10^8$ CNTs/mm$^2$). The average CNT diameter for each array was approximately 20 nm, and the array heights were approximately 40-50 μm.

A technique that exploits the wicking ability of CNTs was developed to apply relatively consistent amounts of paraffin wax to the CNT arrays on Cu foil. The foil/CNT samples and a dish of paraffin wax were heated to approximately 60° C. on a hot plate. The foil/CNT samples were positioned perpendicularly above the dish, and approximately 2 mm of the edge of each sample was submerged in the liquid wax, initiating the wicking process. The samples remained heated and submerged until the liquid wax wetted the entire sample.

Figure 24:
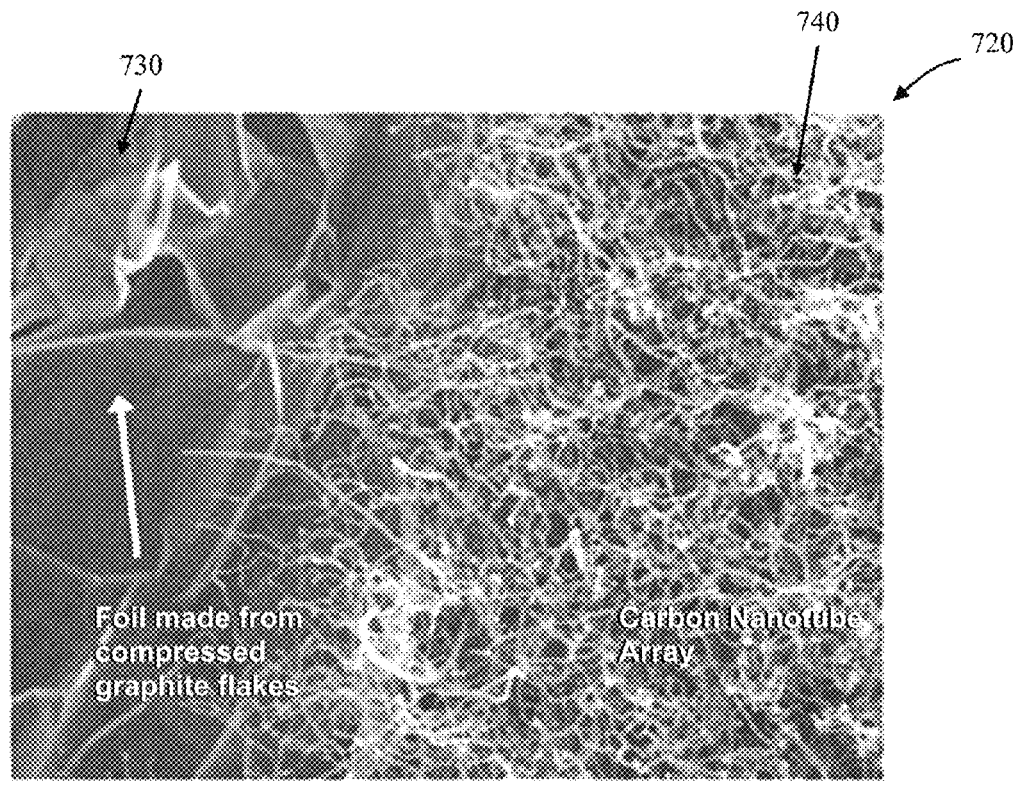
FIG. 24—Scanning electron micrograph of CNTs grown on compressed graphite foil.

FIG. 23 shows schematic representations of one embodiment of the present invention in an application (not to scale). FIG. 24 shows a scanning electron micrograph of a thermal interface material assembly 720 that includes a CNT array 740 grown on graphite foil 730. The CNT array is directly grown on one side of graphite foil. When placed in the interface, under a moderate applied pressure, the apparatus conforms to the interface due to the softness of the exfoliated graphite and compliance of the CNT arrays. This extra conformablity allows the CNTs to better span the interface gap and penetrate into the surface cavities, in effect increasing the real contact area in the interface.

In some embodiments of the present invention, the inherent roughness of the carbon foil (as compared to metal foils discussed herein) can lead to CNT growth that is overall less vertical than for CNTs grown on metal foil. This can result in a spaghetti-like forest of CNTs, although it is believed that such a forest structure may be more compliant and therefore provide improved heat transfer. Referring to FIG. 24, the CNTs of the array 740 in one embodiment of the present invention are aligned substantially vertically to the surface of the carbon foil 730 to which they are attached (and from which they were synthesized). It was observed that the CNTs nucleate near the surface of the carbon foil when the catalyst layer is deposited with e-beam lithography because the metal films stick to the surface. Yet other embodiments of the present invention include the use of a solution-based catalyst, which can lead to nucleation sites throughout the carbon foil. However, CNT sheets and foils tend to have small spacing (a few nanometers) between individual CNTs in the substrate 730. Because of this small spacing (wherein the diameters of the individual CNTs grown in layer 740 are larger than the CNT-to-CNT spacing within foil 730). It is expected that the lateral growth of individual CNTs within the foil will be relatively minimal. For the examples in which the layers 740 were grown from bucky paper or Nanocomp Technologies Inc. samples, no lateral growth of the CNTs of layer 740 was observed within substrate 730.

Figure 25:
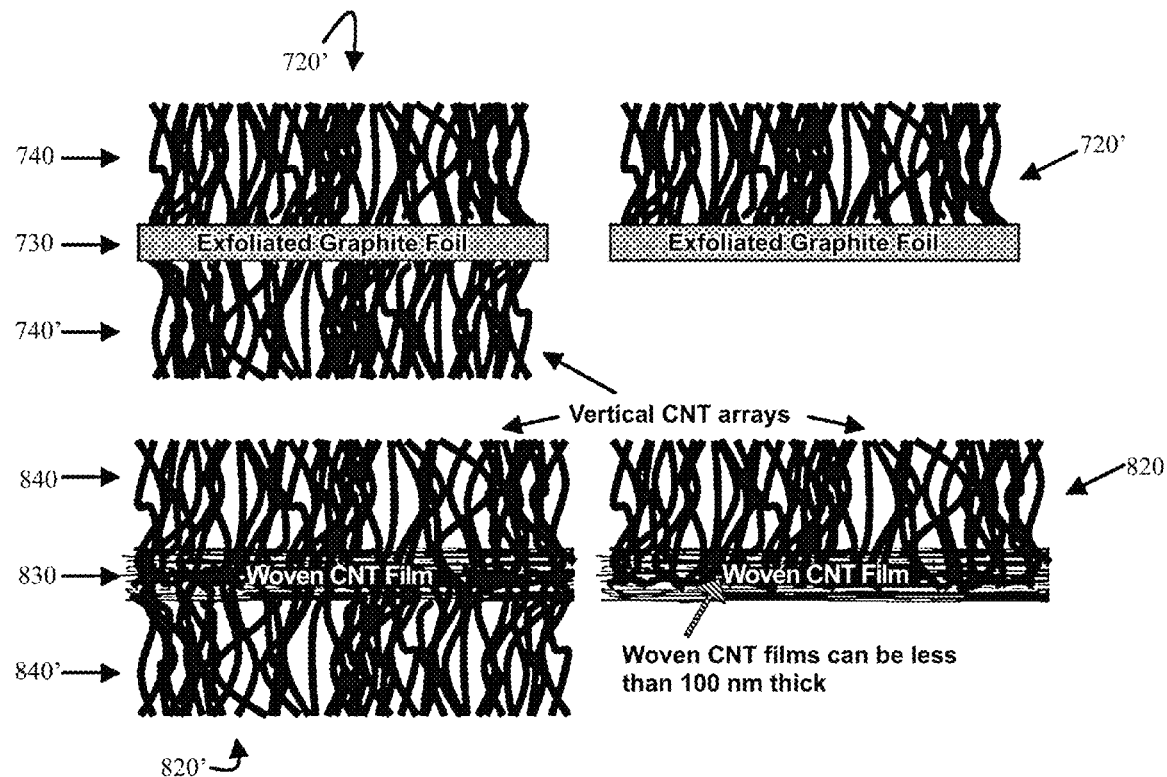
FIG. 25 shows graphical depiction of CNT arrays (both one-sided and two-sided) grown from various carbon substrates according to another embodiment of the present invention.

The carbon-based foils used in the invention can be any combination of fullerenes, graphite, or carbon that can be processed into thin free-standing sheets or foil and are compliant enough to mechanically conform to the roughness of an interface created by mating devices. FIG. 25 shows different embodiments of the present invention.

Figure 26:
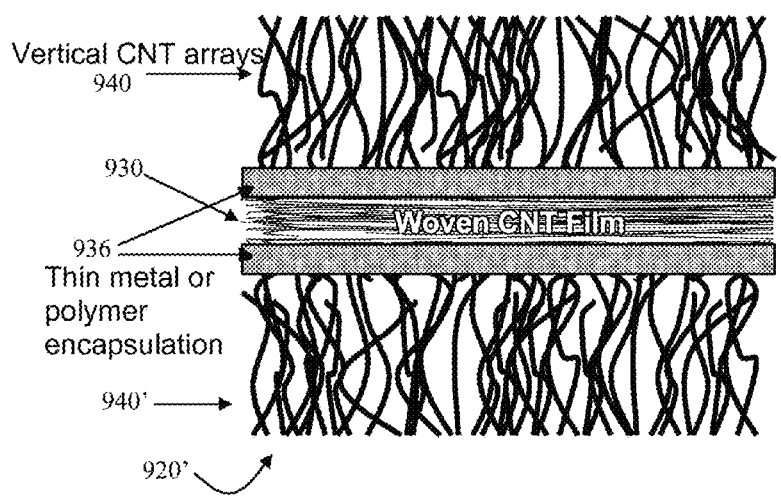
FIG. 26 is a graphical depiction of CNT arrays grown from an encapsulated carbon film according to another embodiment of the present invention.

The carbon sheets can also be a composite of carbon sheets coated with metal or polymer material 936 to improve the mechanical integrity of thermal interface assembly 920' (see FIG. 26). In one embodiment, the carbon foil is coated with a material using any physical vapour deposition process, electron beam deposition, sputter deposition, electrochemical deposition, thermal evaporation deposition, and atomic layer deposition. Various embodiments of the present invention include the materials such as copper, gold, titanium, oxides such as silica, and polymers including wax. In some embodiments, the encapsulated material is applied before the CNT array 740 is grown, although in other embodiments the coating is applied after the arrays are grown, in which embodiments the entire structure 920 is coated. In those embodiments where layer 936 is applied prior to growing layer 940, the catalyst stack of materials is applied after the encapsulating layer. Preferably, the encapsulation layer 936 is thin (on the order of one to ten nanometers).

The CNT arrays 940 and 940' can be synthesized on the surface of the carbon-based substrate 930 using any CNT synthesis technique that allows for dense, vertically oriented CNT arrays to be directly grown on both sides or one side of substrates while having mechanical adhesion between the CNTs and the surfaces (e.g. microwave plasma chemical vapour deposition (MPCVD) and a Ti underlayer on the substrates surfaces to promote adhesion).

Figure 27:
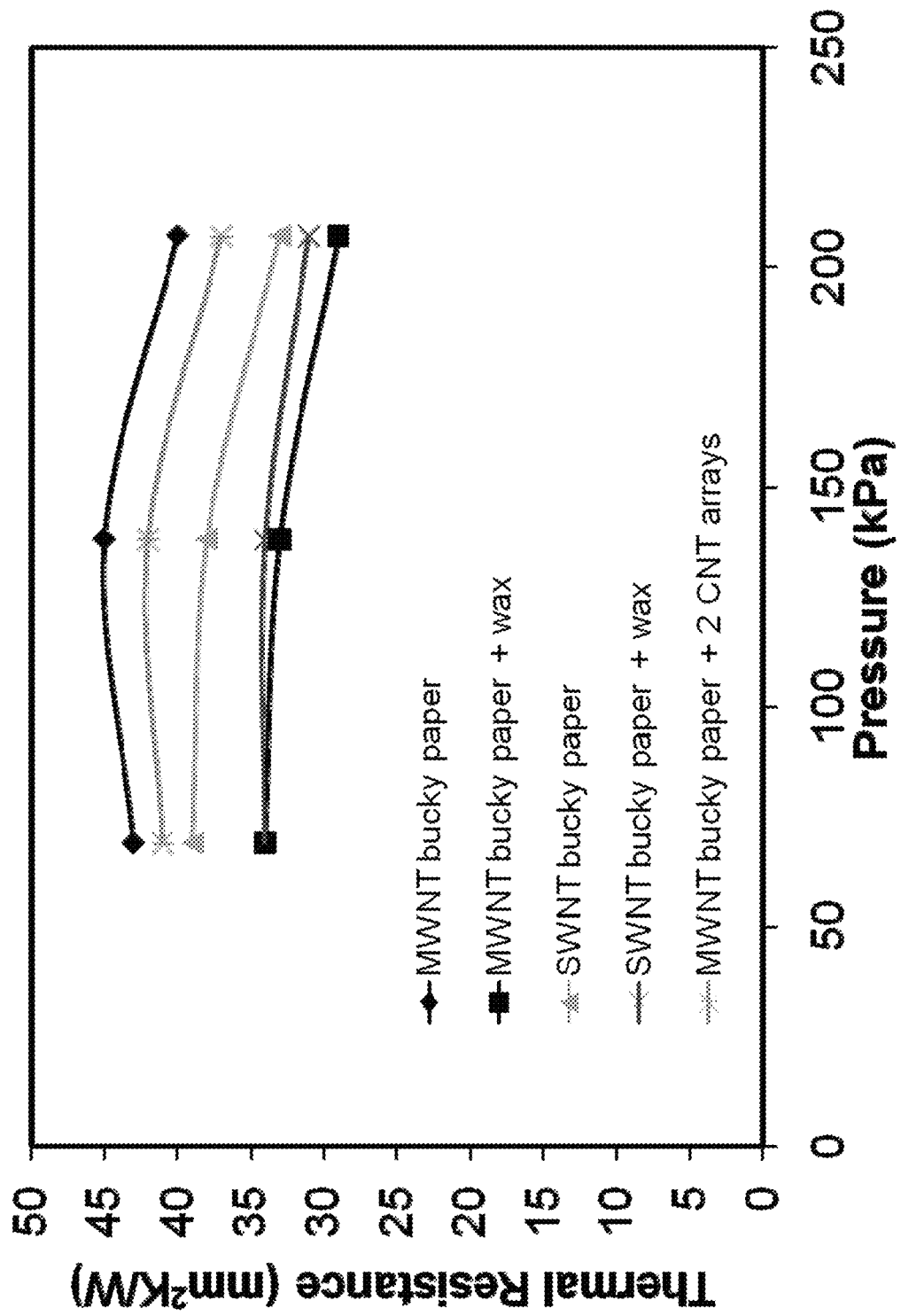
FIG. 27 is a graphical representation of thermal resistance as a function of pressure according to various embodiments of the present invention.

FIG. 27 shows resistance measurements made with multi-walled CNT bucky paper substrates in various configurations with vertical CNT arrays grown on substrate surfaces, and without, as thermal interface materials.

Figure 28:
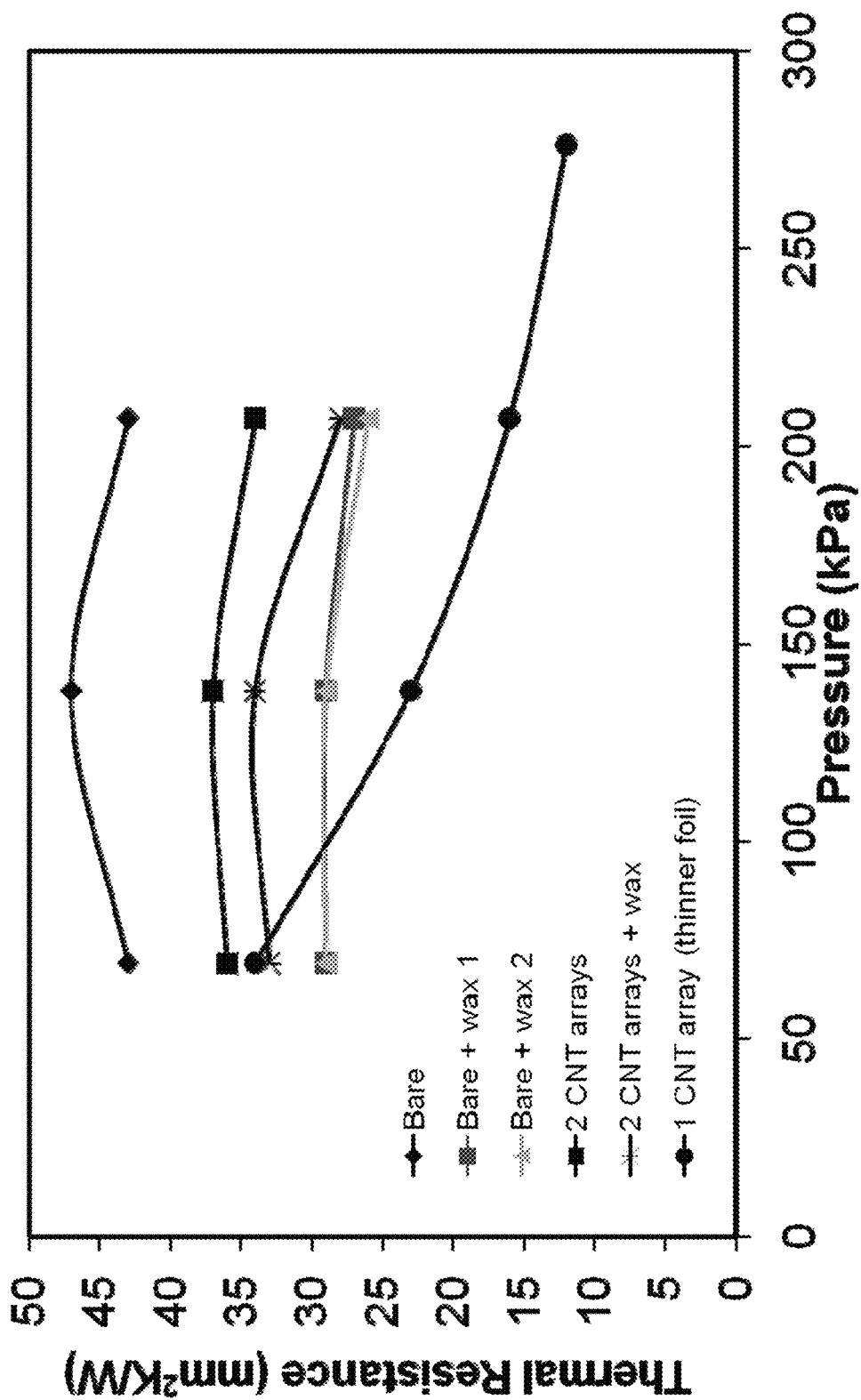
FIG. 28 is a graphical representation of thermal resistance as a function of pressure according to various embodiments of the present invention.

FIG. 28 shows resistance measurements made with commercially purchased multiwalled CNT bucky paper substrates in various configurations with vertical CNT arrays grown on a substrate surfaces, and without, as thermal interface materials. The reference on FIG. 28 to thinner foil refers to a thicker foil that was modified to reduce its thickness. It is estimated that the thinner foil was probably around one hundred nanometers thick. The other two CNT arrays of FIG. 28 were prepared on foils that were about one hundred microns thick.

While the inventions have been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. An apparatus comprising:
a compliant, readily-deformable carbon foil having first and second opposing sides; and
a plurality of nanotubes having one end attached to the first side of said foil and a free end, said nanotubes being substantially aligned vertically to said first side;
wherein the thermal resistance from the free end to the second side of said foil is less than about 50 mm$^2$ K/W; and
wherein said carbon foil has a substantially planar shape and a thickness less than about one hundred nanometers.

2. The apparatus of claim 1, wherein said carbon foil is made from a carbon nanoparticle assembly substantially held together by van der Waals forces or substantially held together by mechanical entanglement.

3. The apparatus of claim 2 wherein said carbon foil is one of CNT buckypaper, woven CNT sheet, graphite sheet, graphene sheet, or exfoliated graphite sheet.

4. The apparatus of claim 2 which further comprises a second plurality of nanoparticles attached to said second side and substantially aligned vertically to said second side.

5. The apparatus of claim 1 wherein said foil includes a layer of catalytic material on said first side, and said nanotubes are grown from said catalytic material at a density greater than about 10$^7$ nanotubes per square millimeter.

6. The apparatus of claim 5 wherein said nanotubes are grown from said catalytic material at a density less than about 10$^9$ nanotubes per square millimeter.

7. The apparatus of claim 5 wherein said carbon foil includes a first layer on at least one side of said foil, an external layer of a catalyst on the one said side of the foil, and a layer of buffer material between said layer of catalyst and said first layer.

8. The apparatus of claim 7 wherein the buffer material comprises at least one of Al, In, Pb, or Sn.

9. The apparatus of claim 7 wherein the catalyst comprises at least one of Fe, Co, Ni, and Pd.

10. The apparatus of claim 2 further comprising a first hotter object having a first surface and a second cooler object having a second surface, wherein the carbon foil is positioned between the first surface and second surface and conducts heat from the first object, through the carbon foil, and into the second object.

11. An apparatus comprising:
a compliant, readily-deformable carbon foil having first and second opposing sides; and
a plurality of nanotubes having one end attached to the first side of said foil and a free end, said nanotubes being substantially aligned vertically to said first side;

wherein the thermal resistance from the free end to the second side of said foil is less than about 50 mm² K/W;

wherein said carbon foil includes a layer of catalytic material on said first side, and said nanotubes are grown from said catalytic material at a density greater than about $10^7$ nanotubes per square millimeter;

wherein said carbon foil includes a first layer on at least one side of said foil, an external layer of a catalyst on the one said side of the foil, and a layer of buffer material between said layer of catalyst and said first layer; and wherein the buffer material comprises at least one of In, Pb, or Sn.

12. The apparatus of claim 11, wherein said carbon foil is made from a carbon nanoparticle assembly substantially held together by van der Waals forces or substantially held together by mechanical entanglement.

13. The apparatus of claim 11 wherein said carbon foil is one of CNT buckypaper, woven CNT sheet, graphite sheet, graphene sheet, or exfoliated graphite sheet.

14. The apparatus of claim 11 which further comprises a second plurality of nanoparticles attached to said second side and substantially aligned vertically to said second side.

15. The apparatus of claim 13 wherein said carbon foil is CNT buckypaper.

16. The apparatus of claim 13 wherein said carbon foil is woven CNT sheet.

17. The apparatus of claim 13 wherein said carbon foil is graphene sheet.

18. The apparatus of claim 13 wherein said carbon foil is exfoliated graphite sheet.

19. The apparatus of claim 11 wherein said carbon foil includes a layer of catalytic material on said first side, and said nanotubes are grown from said catalytic material.

20. The apparatus of claim 11 which further comprises a second plurality of nanoparticles attached to said second side and substantially aligned vertically to said second side.

21. The apparatus of claim 12 wherein said carbon foil is one of CNT buckypaper, woven CNT sheet, graphite sheet, graphene sheet, or exfoliated graphite sheet.

22. The apparatus of claim 12 which further comprises a second plurality of nanoparticles attached to said second side and substantially aligned vertically to said second side.

* * * * *